US009229714B2

(12) United States Patent
Ishii et al.

(10) Patent No.: US 9,229,714 B2
(45) Date of Patent: Jan. 5, 2016

(54) MEMORY CONTROL APPARATUS, MEMORY APPARATUS, INFORMATION PROCESSING SYSTEM, AND PROCESSING METHOD FOR USE THEREWITH

(71) Applicant: Sony Corporation, Tokyo (JP)

(72) Inventors: Ken Ishii, Tokyo (JP); Keiichi Tsutsui, Kanagawa (JP); Yasushi Fujinami, Tokyo (JP); Kenichi Nakanishi, Tokyo (JP); Naohiro Adachi, Tokyo (JP); Hideaki Okubo, Saitama (JP); Tatsuo Shinbashi, Tokyo (JP)

(73) Assignee: Sony Corporation, Tokyo (JP)

( * ) Notice: Subject to any disclaimer, the term of this patent is extended or adjusted under 35 U.S.C. 154(b) by 348 days.

(21) Appl. No.: 13/873,679

(22) Filed: Apr. 30, 2013

(65) Prior Publication Data

US 2013/0339637 A1    Dec. 19, 2013

(30) Foreign Application Priority Data

Jun. 19, 2012  (JP) .................................. 2012-137397
Mar. 12, 2013  (JP) .................................. 2013-048776

(51) Int. Cl.
  *G06F 9/30*  (2006.01)
  *G11C 7/10*  (2006.01)
  *G11C 16/06*  (2006.01)
(52) U.S. Cl.
  CPC ............ *G06F 9/3004* (2013.01); *G11C 7/1006* (2013.01); *G11C 16/06* (2013.01)

(58) Field of Classification Search
  CPC ................... G11B 20/1426; G11B 20/10009; G11C 7/1006; G11C 16/06; G11C 16/10; G06F 12/1441; G06F 1/03; G06F 7/483; G06F 9/355; G06F 9/3004
  See application file for complete search history.

(56) References Cited

U.S. PATENT DOCUMENTS

| 7,876,626 | B2 * | 1/2011 | Mukai et al. ............. 365/189.14 |
| 2004/0098551 | A1 * | 5/2004 | Heo et al. ....................... 711/167 |
| 2013/0272078 | A1 * | 10/2013 | Nakanishi et al. ............ 365/190 |

FOREIGN PATENT DOCUMENTS

JP         2009-230796 A       10/2009

* cited by examiner

*Primary Examiner* — Zhuo H Li
(74) *Attorney, Agent, or Firm* — Michael Best & Friedrich LLP

(57) ABSTRACT

There is provided a memory control apparatus including: a pre-read processing section reading pre-read data from a data area to be written to before a write process in a predetermined data area of a memory cell array; a conversion determination section which, upon selectively allowing the pre-read data to transition to either a first conversion candidate or a second conversion candidate of the write data to be written in the write process, generates a determination result for selecting either of the candidates based on the larger of two values of which one is the number of bits transitioning from the first value to the second value and of which the other is the number of bits transitioning from the second value to the first value; and a conversion control section selecting either of the candidates in accordance with the determination result.

13 Claims, 28 Drawing Sheets

FIG.6

| | | |
|---|---|---|
| PRE-READ DATA | 1 1 1 1 1 1 1 1 1 1 1 1 1 1 1 1 1 1 1 1 1 1 0 0 0 0 0 0 0 0 0 0 | |
| WRITE DATA | 1 1 1 1 1 1 1 1 1 0 0 0 0 0 0 0 0 0 0 0 0 0 1 0 0 0 0 0 0 0 0 0 | |
| NON-INVERSION SET PATTERN ($n_{10}$=13) | 0 0 0 0 0 0 0 0 0 1 1 1 1 1 1 1 1 1 1 1 1 1 0 0 0 0 0 0 0 0 0 0 | |
| NON-INVERSION RESET PATTERN ($n_{01}$=1) | 0 0 0 0 0 0 0 0 0 0 0 0 0 0 0 0 0 0 0 0 0 0 1 0 0 0 0 0 0 0 0 0 | |
| INVERSION SET PATTERN ($n_{11}$=9) | 1 1 1 1 1 1 1 1 1 0 0 0 0 0 0 0 0 0 0 0 0 0 0 0 0 0 0 0 0 0 0 0 | |
| INVERSION RESET PATTERN ($n_{00}$=9) | 0 0 0 0 0 0 0 0 0 0 0 0 0 0 0 0 0 0 0 0 0 0 0 1 1 1 1 1 1 1 1 1 | |

FIG.19

| No | WDATA | | | | wdata0 | | | | wdata1 | | | |
|---|---|---|---|---|---|---|---|---|---|---|---|---|
| 0 | 0 | 0 | 0 | 0 | 0 | 0 | 0 | 0 | 1 | 1 | 1 | 1 |
| 1 | 0 | 0 | 0 | 1 | 0 | 0 | 0 | 1 | 1 | 1 | 0 | 1 |
| 2 | 0 | 0 | 1 | 0 | 0 | 0 | 1 | 0 | 1 | 1 | 1 | 0 |
| 3 | 0 | 0 | 1 | 1 | 0 | 0 | 1 | 1 | 1 | 1 | 0 | 0 |
| 4 | 0 | 1 | 0 | 0 | 0 | 1 | 0 | 0 | 1 | 0 | 1 | 1 |
| 5 | 0 | 1 | 0 | 1 | 0 | 1 | 0 | 1 | 1 | 0 | 1 | 0 |
| 6 | 0 | 1 | 1 | 0 | 0 | 1 | 1 | 0 | 1 | 0 | 0 | 1 |
| 7 | 0 | 1 | 1 | 1 | 0 | 1 | 1 | 1 | 1 | 0 | 0 | 0 |
| 8 | 1 | 0 | 0 | 0 | 1 | 0 | 0 | 0 | 0 | 1 | 1 | 1 |
| 9 | 1 | 0 | 0 | 1 | 1 | 0 | 0 | 1 | 0 | 1 | 1 | 0 |
| 10 | 1 | 0 | 1 | 0 | 1 | 0 | 1 | 0 | 0 | 1 | 0 | 1 |
| 11 | 1 | 0 | 1 | 1 | 1 | 0 | 1 | 1 | 0 | 1 | 0 | 0 |
| 12 | 1 | 1 | 0 | 0 | 1 | 1 | 0 | 0 | 0 | 0 | 1 | 1 |
| 13 | 1 | 1 | 0 | 1 | 1 | 1 | 0 | 1 | 0 | 0 | 1 | 0 |
| 14 | 1 | 1 | 1 | 0 | 1 | 1 | 1 | 0 | 0 | 0 | 0 | 1 |
| 15 | 1 | 1 | 1 | 1 | 1 | 1 | 1 | 1 | 0 | 0 | 0 | 0 |

FIG.20

| PRE-READ DATA | | | | wdata0 | | | | SET BIT COUNT (0→1) | RESET BIT COUNT (1→0) | wdata1 | | | | SET BIT COUNT (0→1) | RESET BIT COUNT (1→0) |
|---|---|---|---|---|---|---|---|---|---|---|---|---|---|---|---|
| 0 | 0 | 0 | 0 | 0 | 0 | 0 | 1 | 1 | 0 | 1 | 1 | 0 | 1 | 3 | 0 |
| 0 | 0 | 0 | 1 | 0 | 0 | 0 | 1 | 0 | 0 | 1 | 1 | 0 | 1 | 2 | 0 |
| 0 | 0 | 1 | 0 | 0 | 0 | 0 | 1 | 1 | 1 | 1 | 1 | 0 | 1 | 3 | 1 |
| 0 | 0 | 1 | 1 | 0 | 0 | 0 | 1 | 0 | 1 | 1 | 1 | 0 | 1 | 2 | 1 |
| 0 | 1 | 0 | 0 | 0 | 0 | 0 | 1 | 1 | 1 | 1 | 1 | 0 | 1 | 2 | 0 |
| 0 | 1 | 0 | 1 | 0 | 0 | 0 | 1 | 0 | 1 | 1 | 1 | 0 | 1 | 1 | 0 |
| 0 | 1 | 1 | 0 | 0 | 0 | 0 | 1 | 1 | 2 | 1 | 1 | 0 | 1 | 2 | 1 |
| 0 | 1 | 1 | 1 | 0 | 0 | 0 | 1 | 0 | 2 | 1 | 1 | 0 | 1 | 1 | 1 |
| 1 | 0 | 0 | 0 | 0 | 0 | 0 | 1 | 1 | 1 | 1 | 1 | 0 | 1 | 2 | 0 |
| 1 | 0 | 0 | 1 | 0 | 0 | 0 | 1 | 0 | 1 | 1 | 1 | 0 | 1 | 1 | 0 |
| 1 | 0 | 1 | 0 | 0 | 0 | 0 | 1 | 1 | 2 | 1 | 1 | 0 | 1 | 2 | 1 |
| 1 | 0 | 1 | 1 | 0 | 0 | 0 | 1 | 0 | 2 | 1 | 1 | 0 | 1 | 1 | 1 |
| 1 | 1 | 0 | 0 | 0 | 0 | 0 | 1 | 1 | 2 | 1 | 1 | 0 | 1 | 1 | 0 |
| 1 | 1 | 0 | 1 | 0 | 0 | 0 | 1 | 0 | 2 | 1 | 1 | 0 | 1 | 0 | 0 |
| 1 | 1 | 1 | 0 | 0 | 0 | 0 | 1 | 1 | 3 | 1 | 1 | 0 | 1 | 1 | 1 |
| 1 | 1 | 1 | 1 | 0 | 0 | 0 | 1 | 0 | 3 | 1 | 1 | 0 | 1 | 0 | 1 |

FIG.21

| PRE-READ DATA | | | | wdata0 | | | | SET BIT COUNT (0→1) | RESET BIT COUNT (1→0) | wdata1 | | | | SET BIT COUNT (0→1) | RESET BIT COUNT (1→0) |
|---|---|---|---|---|---|---|---|---|---|---|---|---|---|---|---|
| 0 | 0 | 0 | 0 | 0 | 0 | 1 | 0 | 1 | 0 | 1 | 1 | 1 | 0 | 3 | 0 |
| 0 | 0 | 0 | 1 | 0 | 0 | 1 | 0 | 1 | 1 | 1 | 1 | 1 | 0 | 3 | 1 |
| 0 | 0 | 1 | 0 | 0 | 0 | 1 | 0 | 0 | 0 | 1 | 1 | 1 | 0 | 2 | 0 |
| 0 | 0 | 1 | 1 | 0 | 0 | 1 | 0 | 0 | 1 | 1 | 1 | 1 | 0 | 2 | 1 |
| 0 | 1 | 0 | 0 | 0 | 0 | 1 | 0 | 1 | 1 | 1 | 1 | 1 | 0 | 2 | 0 |
| 0 | 1 | 0 | 1 | 0 | 0 | 1 | 0 | 1 | 2 | 1 | 1 | 1 | 0 | 2 | 1 |
| 0 | 1 | 1 | 0 | 0 | 0 | 1 | 0 | 0 | 1 | 1 | 1 | 1 | 0 | 1 | 0 |
| 0 | 1 | 1 | 1 | 0 | 0 | 1 | 0 | 0 | 2 | 1 | 1 | 1 | 0 | 1 | 1 |
| 1 | 0 | 0 | 0 | 0 | 0 | 1 | 0 | 1 | 1 | 1 | 1 | 1 | 0 | 2 | 0 |
| 1 | 0 | 0 | 1 | 0 | 0 | 1 | 0 | 1 | 2 | 1 | 1 | 1 | 0 | 2 | 1 |
| 1 | 0 | 1 | 0 | 0 | 0 | 1 | 0 | 0 | 1 | 1 | 1 | 1 | 0 | 1 | 0 |
| 1 | 0 | 1 | 1 | 0 | 0 | 1 | 0 | 0 | 2 | 1 | 1 | 1 | 0 | 1 | 1 |
| 1 | 1 | 0 | 0 | 0 | 0 | 1 | 0 | 1 | 2 | 1 | 1 | 1 | 0 | 1 | 0 |
| 1 | 1 | 0 | 1 | 0 | 0 | 1 | 0 | 1 | 3 | 1 | 1 | 1 | 0 | 1 | 1 |
| 1 | 1 | 1 | 0 | 0 | 0 | 1 | 0 | 0 | 2 | 1 | 1 | 1 | 0 | 0 | 0 |
| 1 | 1 | 1 | 1 | 0 | 0 | 1 | 0 | 0 | 3 | 1 | 1 | 1 | 0 | 0 | 1 |

FIG.22

| No | rdata0 | | | | rdata1 | | | | RDATA | | | |
|---|---|---|---|---|---|---|---|---|---|---|---|---|
| 0  | 0 | 0 | 0 | 0 | 1 | 1 | 1 | 1 | 0 | 0 | 0 | 0 |
| 1  | 0 | 0 | 0 | 1 | 1 | 1 | 0 | 1 | 0 | 0 | 0 | 1 |
| 2  | 0 | 0 | 1 | 0 | 1 | 1 | 1 | 0 | 0 | 0 | 1 | 0 |
| 3  | 0 | 0 | 1 | 1 | 1 | 1 | 0 | 0 | 0 | 0 | 1 | 1 |
| 4  | 0 | 1 | 0 | 0 | 1 | 0 | 1 | 1 | 0 | 1 | 0 | 0 |
| 5  | 0 | 1 | 0 | 1 | 1 | 0 | 1 | 0 | 0 | 1 | 0 | 1 |
| 6  | 0 | 1 | 1 | 0 | 1 | 0 | 0 | 1 | 0 | 1 | 1 | 0 |
| 7  | 0 | 1 | 1 | 1 | 1 | 0 | 0 | 0 | 0 | 1 | 1 | 1 |
| 8  | 1 | 0 | 0 | 0 | 0 | 1 | 1 | 1 | 1 | 0 | 0 | 0 |
| 9  | 1 | 0 | 0 | 1 | 0 | 1 | 1 | 0 | 1 | 0 | 0 | 1 |
| 10 | 1 | 0 | 1 | 0 | 0 | 1 | 0 | 1 | 1 | 0 | 1 | 0 |
| 11 | 1 | 0 | 1 | 1 | 0 | 1 | 0 | 0 | 1 | 0 | 1 | 1 |
| 12 | 1 | 1 | 0 | 0 | 0 | 0 | 1 | 1 | 1 | 1 | 0 | 0 |
| 13 | 1 | 1 | 0 | 1 | 0 | 0 | 1 | 0 | 1 | 1 | 0 | 1 |
| 14 | 1 | 1 | 1 | 0 | 0 | 0 | 0 | 1 | 1 | 1 | 1 | 0 |
| 15 | 1 | 1 | 1 | 1 | 0 | 0 | 0 | 0 | 1 | 1 | 1 | 1 |

MEMORY CONTROL APPARATUS, MEMORY APPARATUS, INFORMATION PROCESSING SYSTEM, AND PROCESSING METHOD FOR USE THEREWITH

BACKGROUND

The present disclosure relates to a memory control apparatus. More particularly, the disclosure relates to a memory control apparatus for a non-volatile memory, a memory apparatus, an information processing system; a processing method for use therewith, and a program for causing a computer to perform the method.

In information processing systems, the DRAM (Dynamic Random Access Memory) or the like is used as a work memory. The DRAM is usually a volatile memory of which the stored content is lost once the supply of power to the memory is removed. Meanwhile, non-volatile memories (NVM) have come to be used in recent years. The non-volatile memories are roughly classified into two categories: flash memories that support access of data in large-size units, and non-volatile random access memories (NVRAM: Non-Volatile RAM) supporting high-speed random access in small-size data units. A representative example of flash memory is the NAND flash memory. Examples of non-volatile random access memory are the ReRAM (Resistance RAM), PCRAM (Phase-Change RAM), and MRAM (Magnetoresistive RAM).

The ReRAM is a non-volatile memory that uses variable resistive elements. Before writing of data to the ReRAM, there is no need to delete data therefrom in blocks. The ReRAM allows only necessary pages to be directly rewritten, as opposed to the NAND flash memory or the like in which threshold values of the charge storage amount in floating gates are stored as data. A variable resistive element can record one-bit information represented by one of a high resistive state (HRS) and a low resistive state (LRS). In non-volatile memories such as the ReRAM, the data to be written to is pre-read for comparison with write data so that only the necessary bits may transition in state. Because the state transitions incur consumption currents, the number of transitioning bits should preferably be minimized. For that purpose, there has been proposed a semiconductor storage system which, if the number of the bits to be rewritten is a majority, inverts the bits of the write data in order to reduce the rewrite bit count (e.g., see Japanese Patent Laid-Open No. 2009-230796).

SUMMARY

According to the above-mentioned related art, whether or not the write data are to be inverted is controlled depending on whether or not the number of bits to be rewritten is a majority. However, for non-volatile memories such as the ReRAM, upper limits are set on consumption currents in each of two cases: one in which the high resistive state transitions to the low resistive state, and the other in which the low resistive state transitions to the high resistive state. The limits may therefore make it insufficient to take into account only the number of transitioning bits.

The present disclosure has been made in view of the above circumstances and provides innovative arrangements for control over memory write operations by taking into consideration the consumption currents to be incurred upon state transition.

According to one embodiment of the present disclosure, there is provided a memory control apparatus including: a pre-read processing section configured to read pre-read data from a data area to be written to before a write process in a predetermined data area of a memory cell array holding either a first value or a second value per bit; a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and a conversion control section configured to select either the first conversion candidate or the second conversion candidate in accordance with the determination result while outputting selection information indicative of which of the two candidates has been selected. This structure provides the effect of selecting one of the conversion candidates of the write data by taking into account the worst-case power consumption to be incurred with one of the conversion candidates, and of outputting selection information indicative of the selected conversion candidate.

According to another embodiment of the present disclosure, there is provided a memory control apparatus including: a pre-read processing section configured to read pre-read data from a data area to be written to before a write process in a predetermined data area of a memory cell array holding either a first value or a second value per bit; a conversion determination section configured to generate a determination result for selectively allowing the pre-read data to transition to either a first conversion candidate or a second conversion candidate of the write data to be written in the write process through comparison of two values, one of the two values compared being the larger of two values of which one is the number of bits transitioning from the first value to the second value and of which the other is the number of bits transitioning from the second value to the first value upon transition of the pre-read data to the first conversion candidate, the other of the two values compared being the larger of two values of which one is the number of bits transitioning from the first value to the second value and of which the other is the number of bits transitioning from the second value to the first value upon transition of the pre-read data to the second conversion candidate, the selection of either the first conversion candidate or the second conversion candidate being made in such a manner that the number of transitioning bits is the smaller of the two numbers compared; and a conversion control section configured to select either the first conversion candidate or the second conversion candidate in accordance with the determination result while outputting selection information indicative of which of the two candidates has been selected. This structure provides the effect of selecting either of the first and the second conversion candidates of the write data by taking into account the worst-case power consumption to be incurred with each of the two candidates, and of outputting selection information indicative of the selected conversion candidate of which the amount of power consumption is the smaller of the two.

Preferably, the conversion determination section may include: a detector configured to detect per bit a combination of transitions from the first value to the second value or from the second value to the first value with regard to the pre-read data, the first conversion candidate and the second conversion candidate; a counter configured to count the number of bits detected for each of the combinations; a selector configured to select the larger of two values of which one is the number of bits transitioning from the first value to the second value and of which the other is the number of bits transitioning from the second value to the first value with regard to each of the first conversion candidate and the second conversion candidate; and a comparator configured to compare the selected numbers of transitioning bits with regard to each of the first conversion candidate and the second conversion candidate to select as the determination result either the first conversion candidate or the second conversion candidate in such a manner that the number of transitioning bits is the smaller of the two numbers compared.

Preferably, the memory control apparatus may further include a write buffer configured to hold the write data and the selection information. The conversion control section may cause the write data held in the write buffer to be converted to either the first conversion candidate or the second conversion candidate in accordance with the determination result while causing the write buffer to hold the selection information indicative of either of the two candidates to which the write data is converted.

Preferably, the first conversion candidate may be a value obtained by performing an exclusive-OR operation on the write buffer and on a predetermined value, and the second conversion candidate may be a value obtained by performing an exclusive-OR operation on the write buffer and on the inverted value of the predetermined value.

Preferably, the first conversion candidate may be acquired by performing either a predetermined bit shift operation or a predetermined bit transposition operation or a combination of these operations on the value obtained by performing an exclusive-OR operation on the write buffer and on a predetermined value, and the second conversion candidate may be acquired by performing either the predetermined bit shift operation or the predetermined bit transposition operation or a combination of these operations on the value obtained by performing an exclusive-OR operation on the write buffer and on the inverted value of the predetermined value.

Preferably, the first conversion candidate may be the same value as that held in the write buffer, and the second conversion candidate may be the inverted value of the value held in the write buffer.

Preferably, the first conversion candidate and the second conversion candidate may each be determined in such a manner that either the larger of two values of which one is the number of bits transitioning from the first value to the second value and of which the other is the number of bits transitioning from the second value to the first value upon transition of the pre-read data to the first conversion candidate, or the larger of two values of which one is the number of bits transitioning from the first value to the second value and of which the other is the number of bits transitioning from the second value to the first value upon transition of the pre-read data to the second conversion candidate, becomes half or less of the total bit length of the write data.

According to a further embodiment of the present disclosure, there is provided a memory control apparatus including: a pre-read processing section configured to read pre-read data from a data area to be written to before a write process in a predetermined data area of a memory cell array holding either a first value or a second value per bit; a conversion determination section configured such that upon selectively allowing the pre-read data to transition to either a first conversion candidate or a second conversion candidate of the write data to be written in the write process, the conversion determination section compares the larger of two values of which one is the number of bits transitioning from the first value to the second value and of which the other is the number of bits transitioning from the second value to the first value upon transition of the pre-read data to the first conversion candidate, with half the total bit length of the write data so as to generate a determination result for selecting the first conversion candidate if the larger number of transitioning bits of the two numbers compared is less than half the total bit length of the write data and for selecting the second conversion candidate if otherwise; and a conversion control section configured to select either the first conversion candidate or the second conversion candidate in accordance with the determination result while outputting selection information indicative of which of the two candidates has been selected. This structure provides the effect of selecting either of the first and the second conversion candidates of the write data by taking into account the worst-case power consumption to be incurred with each candidate, the selection being made in such a manner that the power consumption of the selected candidate is less than half that of the other candidate, the structure further outputting selection information indicative of the selected candidate.

According to an even further embodiment of the present disclosure, there is provided a memory apparatus including: a memory cell array configured to hold either of a first value or a second value per bit; a pre-read processing section configured to read pre-read data from a data area to be written to before a write process in a predetermined data area of the memory cell array; a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and a conversion control section configured to select either the first conversion candidate or the second conversion candidate in accordance with the determination result while outputting selection information indicative of which of the two candidates has been selected. This structure provides the effect of selecting one of the conversion candidates of the write data by taking into account the worst-case power consumption to be incurred with either of the conversion candidates, and of storing the write data.

Preferably, the memory cell array may be composed of variable resistive elements.

According to a still further embodiment of the present disclosure, there is provided an information processing system including: a memory cell array configured to hold either of a first value or a second value per bit; a pre-read processing section configured to read pre-read data from a data area to be written to before a write process in a predetermined data area of the memory cell array; a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; a conversion control section configured to select either the first conversion candidate or the second conversion candidate in accordance with the determination result while outputting selection information indicative of which of the two candidates has been selected; and a host computer configured to issue a read command or a write command to the memory cell array. This structure provides the effect of selecting one of the conversion candidates of the write data by taking into account the worst-case power consumption to be incurred with either candidate when a write command is issued, and of storing the write data.

According to a yet further embodiment of the present disclosure, there is provided a memory control method including: reading pre-read data from a data area to be written to before a write process in a predetermined data area of a memory cell array holding either a first value or a second value per bit; upon selectively allowing the pre-read data to transition to either a first conversion candidate or a second conversion candidate of the write data to be written in the write process, generating a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and selecting either the first conversion candidate or the second conversion candidate in accordance with the determination result while outputting selection information indicative of which of the two candidates has been selected.

The present disclosure outlined above provides the advantageous effect of controlling memory write operations by taking into consideration the consumption currents to be incurred upon state transition.

BRIEF DESCRIPTION OF THE DRAWINGS

FIG. 6 is an illustration showing a specific application example of the embodiment;

FIG. 19 is an illustration showing how a table look-up is typically used in generating conversion candidates with the third embodiment;

FIG. 20 is an illustration summarizing the numbers of bits to be set and reset in a first pattern indicated in FIG. 19;

FIG. 21 is an illustration summarizing the numbers of bits to be set and reset in a second pattern indicated in FIG. 19;

FIG. 22 is an illustration showing how a table look-up is typically used for reverse conversion with the third embodiment;

DETAILED DESCRIPTION OF THE PREFERRED EMBODIMENTS

Some embodiments in which the present disclosure is implemented (called the embodiments hereunder) are described below. The description will be given under the following headings:

1. First embodiment (example of inversion control with the non-volatile memory)
2. Second embodiment (example of inversion control with the memory controller)
3. Third embodiment (example of conversion control with the non-volatile memory)<

1. First Embodiment

[Configuration of the Information Processing System]

Figure 1:
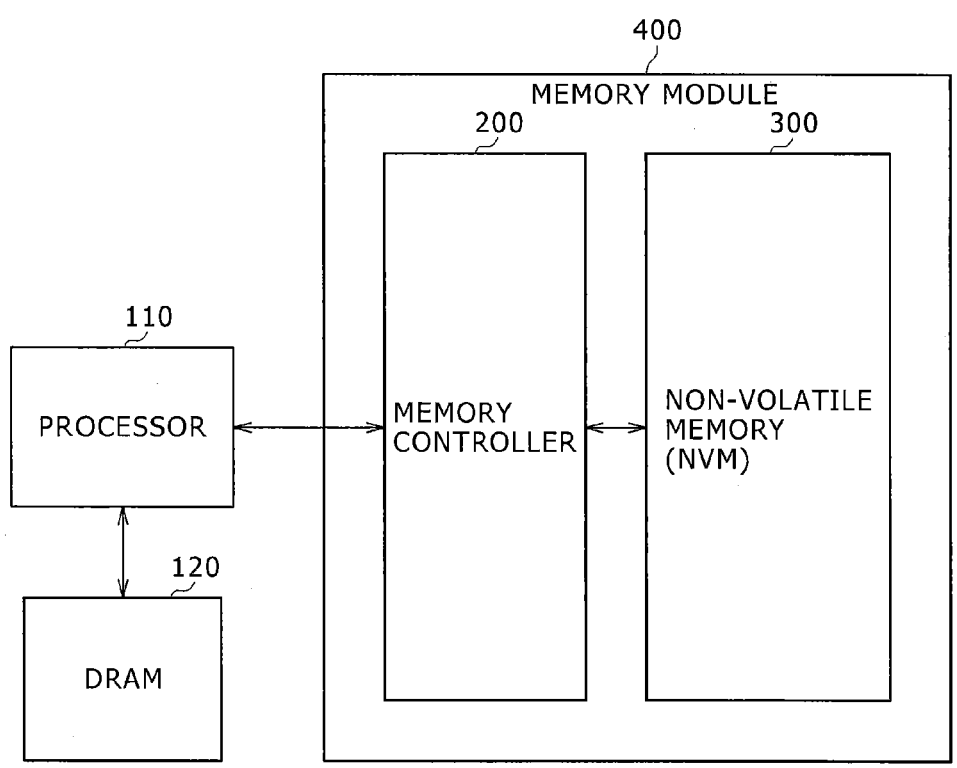
FIG. 1 is an illustration showing a typical overall configuration of an information processing system embodying the present disclosure.

FIG. 1 is an illustration showing a typical overall configuration of an information processing system embodying the present disclosure. This information processing system includes a processor 110, a DRAM 120, a non-volatile memory (NVM) 300, and a memory controller 200. The non-volatile memory 300 and the memory controller 200 constitute a memory module 400. The memory module 400 is an example of the memory apparatus described in the appended claims. The processor 110 is an example of the host computer described in the appended claims.

The processor 110 performs information processing by executing various programs. Using a storage area in the DRAM 120 as a work area, the processor 110 loads or stores data to or from the work area in executing the programs. Also, the processor 110 accesses items of data stored in the NVM 300 via the memory controller 200.

The DRAM 120 is a volatile memory that functions as a main storage device of the processor 110. The DRAM 120 stores the data necessary for the processor 110 to execute the programs.

The non-volatile memory 300 functions as an auxiliary storage device to the processor 110. The non-volatile memory 300 is accessed under control of the memory controller 200. The non-volatile memory 300 may also be composed of a flash memory or a non-volatile random access memory (NVRAM). This non-volatile memory 300 may be applied to a store-and-download (SnD) model or to an execute-in-plane (XIP) model. In the SnD model, the data in the non-volatile memory 300 is accessed by the processor 110 via the DRAM 120. That is, the data in the non-volatile memory 300 is transferred temporarily to the DRAM 120 and made accessible in that memory space. In the XIP model, on the other hand, the data stored in the non-volatile memory 300 is directly accessible from the processor 110 in that memory space. In the case of the XIP model, the DRAM 120 may be eliminated by letting the non-volatile memory 300 play the role of the DRAM 120.

The memory controller 200 is designed to control the non-volatile memory 300, connecting it with the processor 110. The memory controller 200 has a data buffer for transferring data to and from the non-volatile memory 300. The data buffer may also be implemented as an external memory device to the memory controller 200 or as an internal memory thereof. Incidentally, the memory controller 200 is an example of the memory control apparatus described in the appended claims.

[Structure of the Non-Volatile Memory]

Figure 2:
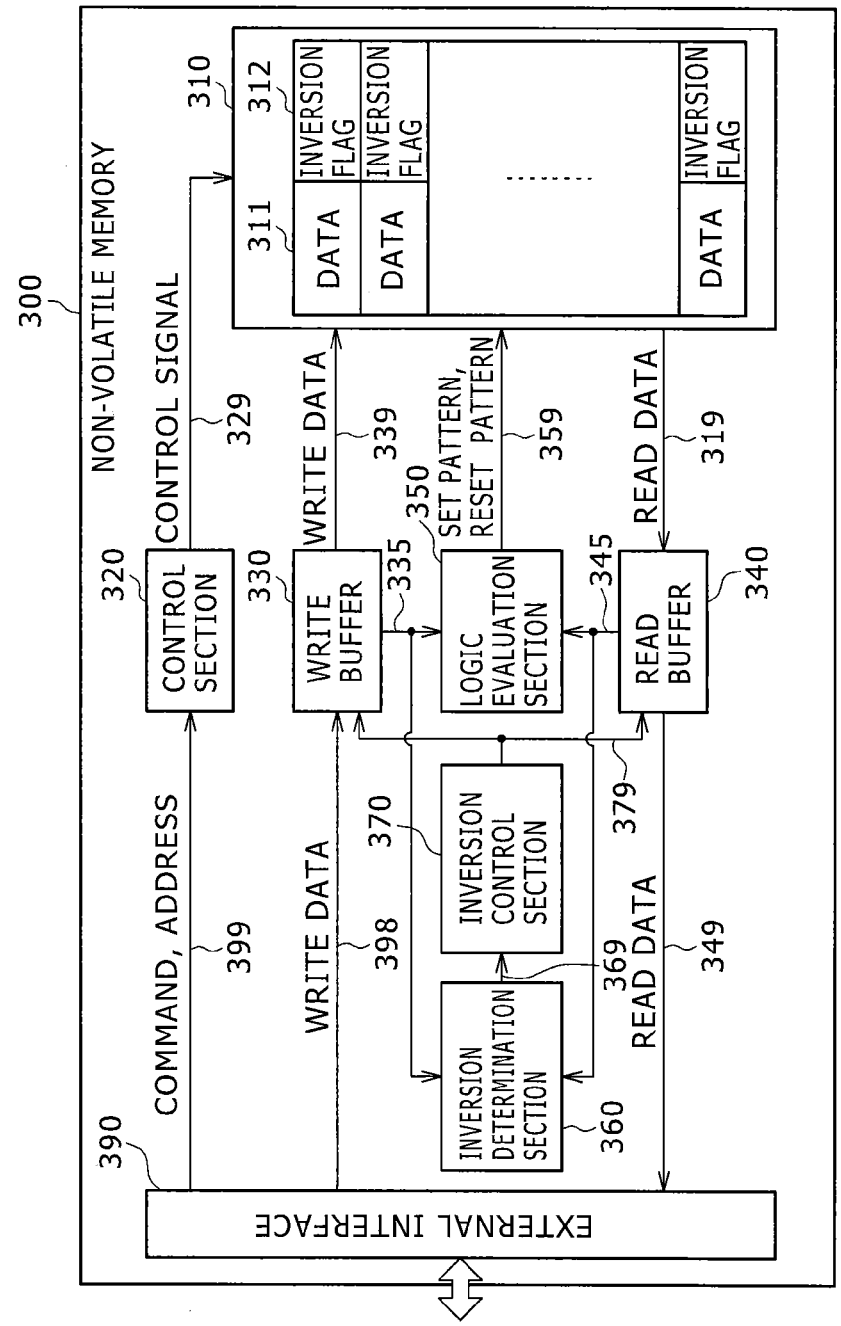
FIG. 2 is an illustration showing a typical structure of a non-volatile memory in a first embodiment of the present disclosure.

FIG. 2 is an illustration showing a typical structure of the non-volatile memory 300 in the first embodiment of the present disclosure. The non-volatile memory 300 includes a memory cell array 310, a control section 320, a write buffer 330, a read buffer 340, a logic evaluation section 350, an inversion determination section 360, an inversion control section 370, and an external interface (I/F) 390.

The memory cell array 310 is made up of memory cells arranged in a grid-like pattern to hold a predetermined state per bit. The memory cell array 310 constitutes a resistance change memory composed of variable resistive elements. A variable resistive element can record one-bit information represented by either a high resistive state (HRS) or a low resistive state (LRS). Whereas each of these resistive states may represent a "0" or a "1," it is assumed in the ensuing description that the logic state of the HRS is "1" and that of the HRS is "0."

The memory cell array 310 is made up of a plurality of pages. Each of the pages stores data 311 and an inversion flag 312. The data 311 is assumed to be 32-bit data constituting one word, for example. The inversion flag 312 indicates whether or not the corresponding data 311 is stored in the inverted state in the memory cell array 310. The inversion flag 312 may represent either of the inverted and non-inverted states when set to "0" or "1." For example, the inversion flag 312 may be cleared to "0" when the data 311 is stored in the non-inverted state and asserted to "1" when the data 311 is stored in the inverted state. The inversion flag 312 is an example of the selection information described in the appended claims. Although a one-bit inversion flag 312 is logically sufficient for one page of data 311, there may be provided a plurality of flag bits to improve reliability.

The control section 320 is a controller that controls the blocks making up the non-volatile memory 300. The control section 320 receives commands and address from the external interface 390 via a signal line 399, and outputs control signals to the memory cell array 310 via a signal line 329.

The write buffer 330 is a buffer that holds write data for the memory cell array 310. The write buffer 330 receives write data from the external interface 390 via a signal line 398 and outputs the write data to the memory cell array 310 via a signal line 339. The write data held in the write buffer 330 is supplied to the logic evaluation section 350 and inversion determination section 360 via a signal line 335. In addition to the data, the write buffer 330 holds an inversion flag as in the memory cell array 310. Given instructions from the inversion control section 370, the write buffer 330 inverts the write data held therein and asserts the corresponding inversion flag to "1," for example.

The read buffer 340 is a buffer that holds read data retrieved from the memory cell array 310. The read buffer 340 receives read data from the memory cell array 310 via a signal line 319 and outputs the read data to the external interface 390 via a signal line 349. The read data held in the read buffer 340 is supplied to the logic evaluation section 350 and inversion determination section 360 via a signal line 345. In addition to the data, the read buffer 340 holds an inversion flag as in the memory cell array 310. Given instructions from the inversion control section 370, the read buffer 340 inverts the read data held therein and asserts the corresponding inversion flag to "1." It should be noted that this inversion operation is not performed upon pre-read. Incidentally, the read buffer 340 is an example of the pre-read processing section described in the appended claims.

The logic evaluation section 350 compares the read data held in the read buffer 340 with the write data retained in the write buffer 330 so as to generate a set pattern and a reset pattern for the memory cell array 310. The write data held in the write buffer 330 is the data targeted for a write process. The read data held in the read buffer 340 is the pre-read data that was read from a write address prior to the write process. The set pattern is a bit pattern that involves, for example, setting to "1" each of only those bits in the data that are caused to transition from HRS to LRS. The reset pattern is a bit pattern that involves, for example, setting to "1" each of only those bits in the data that are caused to transition from LRS to HRS.

The inversion determination section 360 compares the read data held in the read buffer 340 with the write data retained in the write buffer 330 so as to determine whether or not to invert the write data held in the write buffer 330. The result of the determination by the inversion determination section 360 is output to the inversion control section 370 via a signal line 369. Incidentally, the inversion determination section 360 is an example of the conversion determination section described in the appended claims. The detailed processing by the inversion determination section 360 will be discussed later.

In accordance with the determination result from the inversion determination section 360, the inversion control section 370 instructs the write buffer 330 or read buffer 340 to invert the data held therein via a signal line 379. Incidentally, the inversion control section 370 is an example of the inversion control section or conversion control section described in the appended claims.

The external interface 390 is an interface that exchanges data with the memory controller 200.

[State Transition of Variable Resistive Elements]

Figure 3:
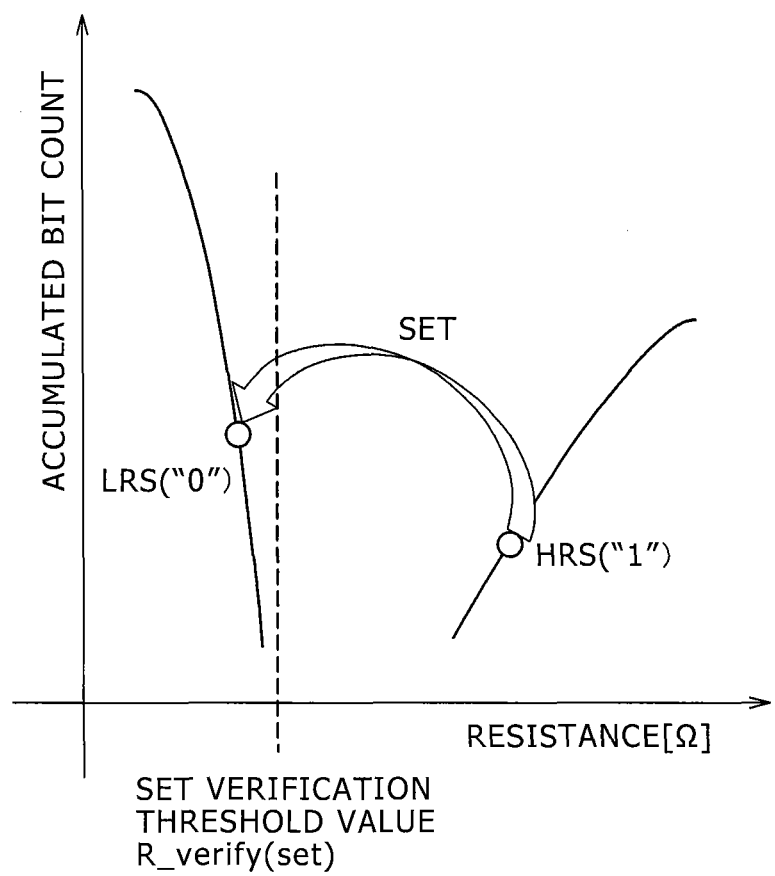
FIG. 3 is an illustration explanatory of a set operation of variable resistive elements.

FIG. 3 is an illustration explanatory of a set operation of variable resistive elements. As explained above, each variable resistive element takes on one of the two states: high resistive state (HRS) or low resistive state (LRS). In a graphic representation where the horizontal axis denotes resistance values of variable resistive elements and the vertical axis represents the number of their accumulated bits, the distribution of the states falls into two portions: one in which the resistance value is low and the other in which the resistance value is high. The low resistance value portion stands for LRS and the high resistance value portion for HRS. As shown in this illustration, the operation for causing state transition from HRS to LRS is called a set operation. In this case, following the set operation, whether or not the set operation has been normally completed is verified using a set verification threshold value R_verify(set) established on the low resistance side from the middle between the two distribution portions. If the verification fails, another set operation is attempted.

Figure 4:
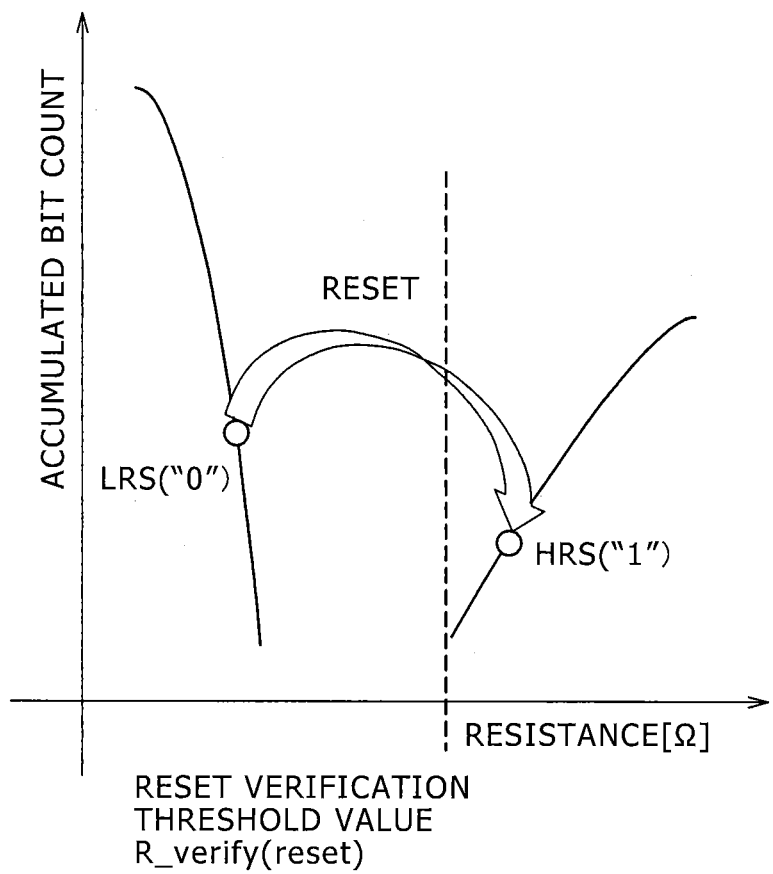
FIG. 4 is an illustration explanatory of a reset operation of variable resistive elements.

FIG. 4 is an illustration explanatory of a reset operation of variable resistive elements. The operation for causing state transition from LRS to HRS as shown in this illustration is called a reset operation. In this case, following the reset operation, whether or not the reset operation has been normally completed is verified using a reset verification threshold value R_verify(reset) established on the high resistance side from the middle between the two distribution portions. If the verification fails, another reset operation is attempted.

[Structure of the Inversion Determination Section]

Figure 5:
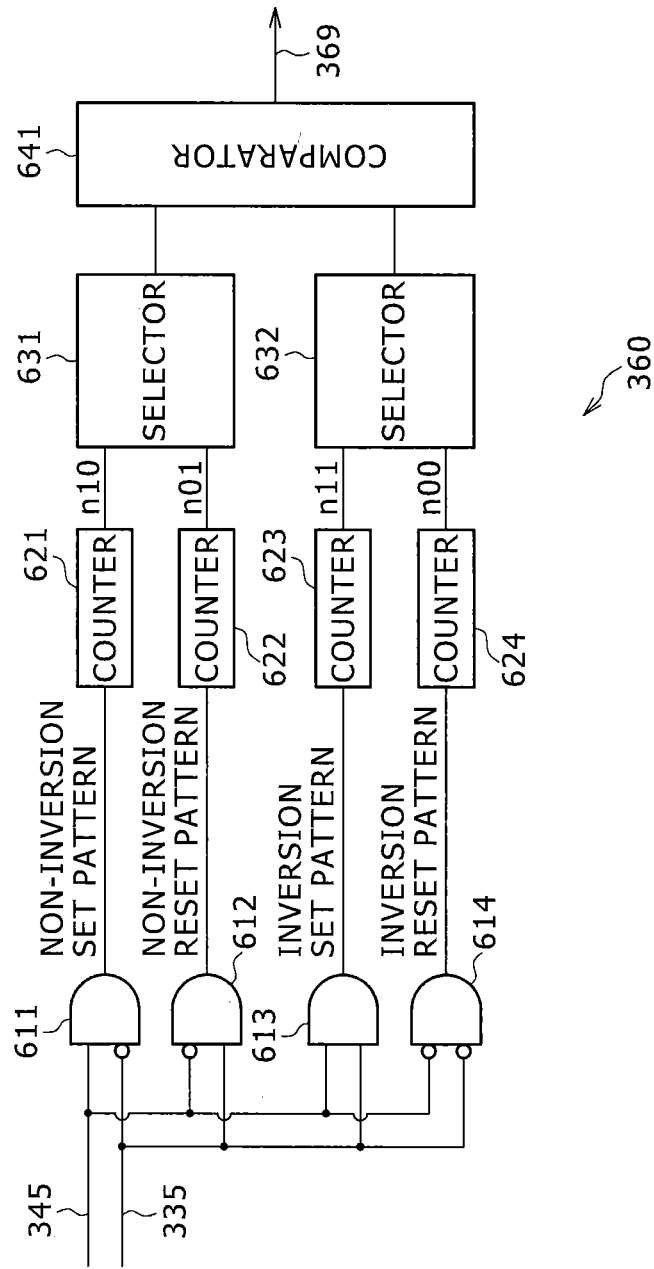
FIG. 5 is an illustration showing a typical structure of an inversion determination section in the embodiment.

FIG. 5 is an illustration showing a typical structure of the inversion determination section 360 in the embodiment of this disclosure. The read data (pre-read data) held in the read buffer 340 is input to the inversion determination section 360 via the signal line 345, and the write data retained in the write buffer 330 is input to the inversion determination section 360 via the signal line 335. It is assumed here that the pre-read data and write data are input one corresponding bit at a time. Alternatively, a plurality of bits may be input in parallel and counted collectively. For example, 32-bit write data and 32-bit pre-read data may be input collectively to generate a 32-bit pattern in which the bits set to "1" each are counted. The inversion determination section 360 includes logic gates 611 through 614, counters 621 through 624, selectors 631 and 632, and a comparator 641. Incidentally, the logic gates 611 through 614 are an example of the detector described in the appended claims.

The logic gate 611 detects a bit of which the transition from pre-read data to write data is from "1" to "0," i.e., the bit to be set upon non-inversion of write data. The counter 621 counts the number of bits detected by the logic gate 611. The value n10 counted by the counter 621 represents the number of bits to be set upon non-inversion.

The logic gate 612 detects a bit of which the transition from pre-read data to write data is from "0" to "1," i.e., the bit to be reset upon non-inversion of write data. The counter 622 counts the number of bits detected by the logic gate 612. The value n01 counted by the counter 622 represents the number of bits to be reset upon non-inversion.

The logic gate 613 detects a bit of which the transition from pre-read data to write data is from "1" to "1," i.e., the bit to be set upon inversion of write data. The counter 623 counts the number of bits detected by the logic gate 613. The value n11 counted by the counter 623 represents the number of bits to be set upon inversion.

The logic gate 614 detects a bit of which the transition from pre-read data to write data is from "0" to "0," i.e., the bit to be reset upon inversion of write data. The counter 624 counts the number of bits detected by the logic gate 614. The value n00 counted by the counter 624 represents the number of bits to be reset upon inversion.

The selector 631 selects the larger of two values: n10 output from the counter 621 and n01 from the counter 622. That is, the selector 631 outputs the larger of two bit counts: the number of transitioning bits for a set and the number of transitioning bits for a reset upon non-inversion of write data.

The selector 632 selects the larger of two values: n11 output from the counter 623 and n00 from the counter 624. That is, the selector 632 outputs the larger of two bit counts: the number of transitioning bits for a set and the number of transitioning bits for a reset upon inversion of write data.

The comparator 641 compares the output of the selector 631 with that of the selector 632, and outputs the smaller of the two compared values as a determination result via the signal line 369. That is, the comparator 641 gives a determination result indicating that the write data is not to be inverted if the output of the selector 631 is the smaller, and a determination result saying that the write data is to be inverted if the output of the selector 632 is the smaller. If the two selectors give the same output, the comparator 641 may provide either of the two results of determination.

Specific Example

FIG. 6 is an illustration showing a specific application example of the embodiment. In this example, it is assumed that the pre-read data is "0xFFFFFC00" ("0x" means that the number following it is a hexadecimal number; ditto hereunder) and that the write data is "0xFF800200."

Comparing the corresponding bits with one another in the 32 bits provides set and reset patterns for non-inversion and inversion of write data. That is, a set pattern for non-inversion of write data is obtained as the output of the logic gate 611, and a reset pattern for non-inversion of write data is acquired as the output of the logic gate 612. Also, a set pattern for inversion of write data is obtained as the output of the logic gate 613, and a reset pattern for inversion of write data is acquired as the output of the logic gate 614.

As a result, the number of transitioning bits n10 in the set pattern upon non-inversion is "13," the number of transitioning bits n01 in the reset pattern upon non-inversion is "1," the number of transitioning bits n11 in the set pattern upon inversion is "9," and the number of transitioning bits n00 in the reset pattern upon inversion is "9."

Upon non-inversion of write data, the number of transitioning bits n10 in the set pattern is the larger of the two numbers. This causes the selector 631 to select "13." Upon inversion of write data, the two numbers of transitioning bits are the same. This causes the selector 632 to select "9." In this case, the output of the selector 632 is the smaller of the two outputs, so that the comparator 641 gives a determination result indicating that the write data is to be inverted.

Incidentally, if the numbers of transitioning bits are compared without distinction between set and reset as with the related art, then the total number of transitioning bits upon non-inversion is "14" and the total number of transitioning bits upon inversion is "18." This will bring about a determination indicating that the write data is not to be inverted. With the embodiment of this disclosure, by contrast, the numbers of transitioning bits are evaluated while the case of a set and that of a reset are distinguished from each other, so that the determination may be performed appropriately by taking into account the consumption currents to be incurred upon state transition.

[Operation of the Non-Volatile Memory]

Figure 7:
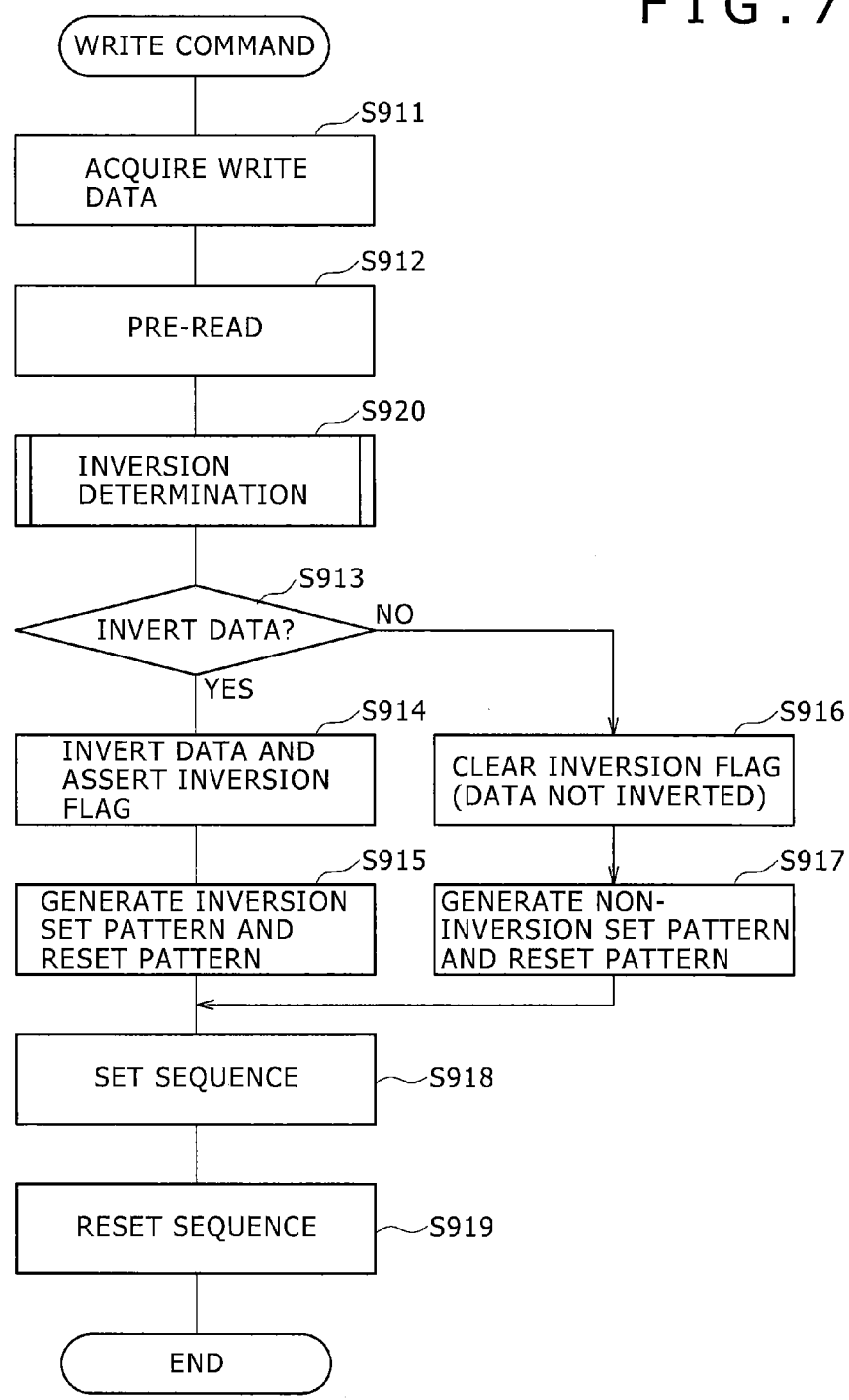
FIG. 7 is a flowchart showing a typical write procedure for the non-volatile memory in the first embodiment.

FIG. 7 is a flowchart showing a typical write procedure for the non-volatile memory 300 in the first embodiment of this disclosure.

When the processor 110 issues a write command, the write buffer 330 holds write data (step S911). From that page in the memory cell array 310 which is indicated by a write address, the read data and inversion flag are retrieved as pre-read data and retained in the read buffer 340 (step S912). The acquisition of the write data and the pre-read process may be performed in reverse order.

Based on the write data held in the write buffer 330 and on the pre-read data retained in the read buffer 340, the inversion determination section 360 determines whether or not to invert the write data in the write buffer 330 (step S920). If it is determined that the write data is to be inverted ("Yes" in step S913), the write data is inverted in the write buffer 330 and the corresponding inversion flag is asserted (step S914). In this case, the logic evaluation section 350 generates a set pattern and a reset pattern for inversion (step S915). On the other hand, if it is determined that the write data is not to be inverted ("No" in step S913), the write data is left intact and the corresponding inversion flag is cleared (step S916). In this case, the logic evaluation section 350 generates a set pattern and a reset pattern for non-inversion (step S917).

Alternatively, instead of being generated in step S915, the set and reset patterns for inversion may be generated in step S932 of FIG. 9 (to be discussed later) detailing step S920. Also, instead of being generated in step S917, the set and reset patterns for non-inversion may be generated in step S922 of FIG. 8 (to be discussed later) detailing step S920.

Thereafter, in accordance with the generated set pattern, a set operation is carried out to perform state transition from HRS to LRS (step S918). In addition, in accordance with the generated reset pattern, a reset operation is carried out to perform state transition from LRS to HRS (step S919). The set and reset operations may be carried out in reverse order.

Figure 8:
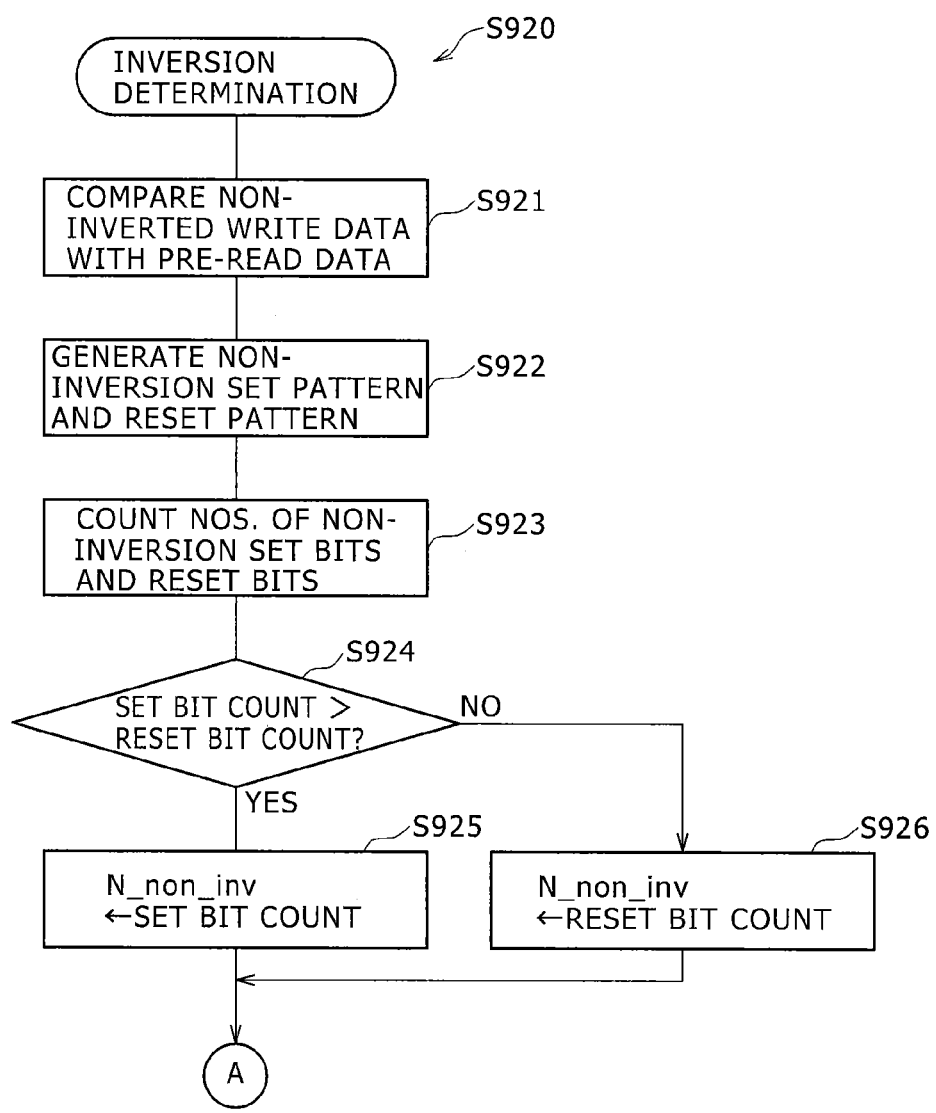
FIG. 8 is a flowchart showing the first half of a typical procedure of an inversion determination process with the embodiment.
Figure 9:
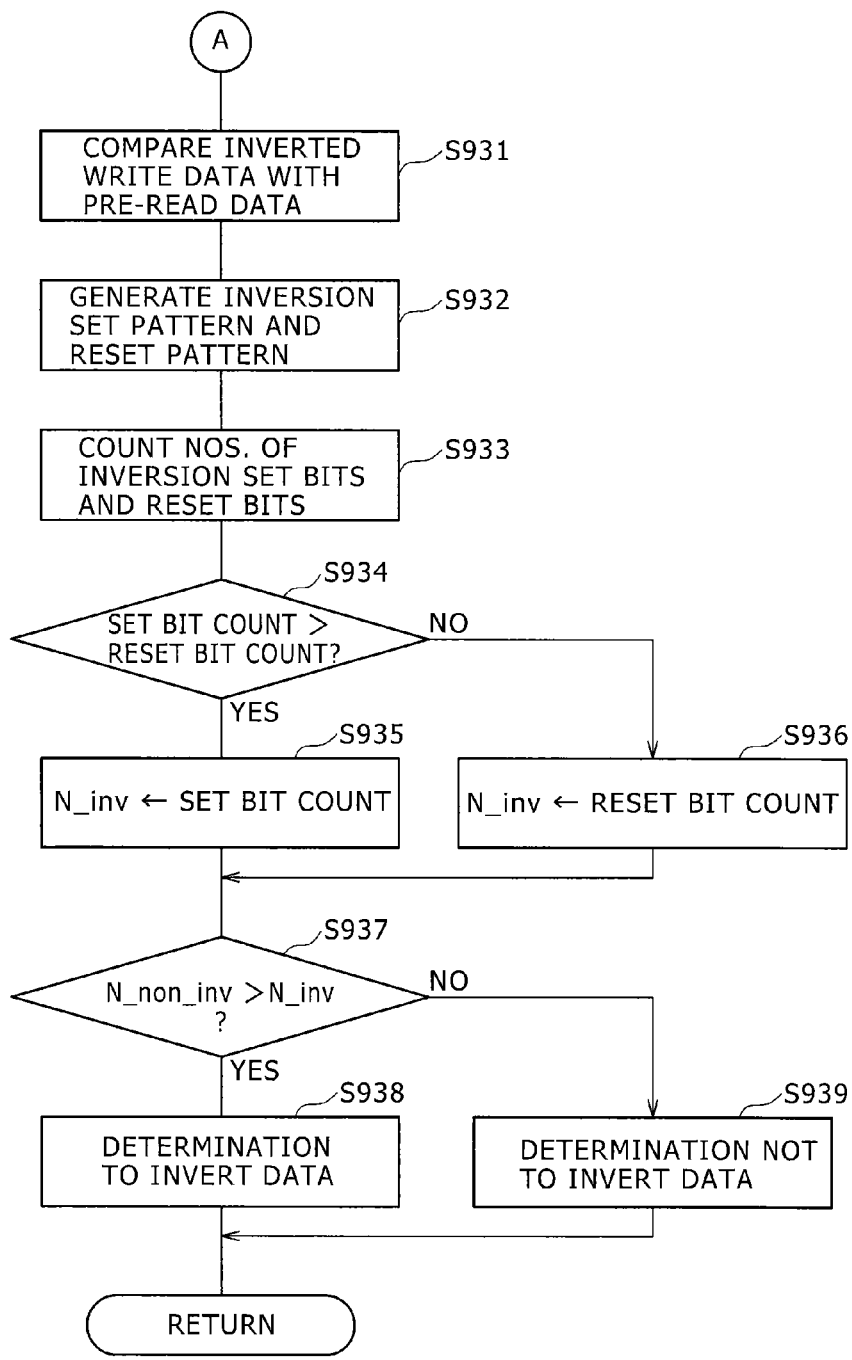
FIG. 9 is a flowchart showing the second half of the typical procedure of the inversion determination process with the embodiment.

FIGS. 8 and 9 are flowcharts showing a typical procedure of the inversion determination process (i.e., step S920) with the embodiment of this disclosure.

The logic gates 611 and 612 compare the write data and pre-read data for non-inversion (step S921), thereby generating a set pattern and a reset pattern for non-inversion of write data, respectively (step S922). In addition, the counters 621 and 622 count the number of bits n10 to be set and the number of bits n01 to be reset, respectively, upon non-inversion of write data (step S923).

As a result, if the number of bits n10 to be set is larger than the number of bits n01 to be reset upon non-inversion of write data ("Yes" in step S924), the selector 631 selects the number of bits n10 to be set as an output value N_non_inv (step S925). On the other hand, if the number of bits n10 to be set is not larger than the number of bits n01 to be reset ("No" in step S924), the selector 631 selects the number of bits n01 to be reset as the output value N_non_inv (step S926).

The logic gates 613 and 614 compare the inverted write data and the pre-read data (in step S931), thereby generating a set pattern and a reset pattern, respectively, upon inversion of write data (step S932). In addition, the counters 623 and 624 count the number of bits n11 to be set and the number of bits n00 to be reset, respectively, upon inversion of write data (step S933).

As a result, if the number of bits n11 to be set is larger than the number of bits n00 to be reset upon inversion of write data ("Yes" in step S934), the selector 632 selects the number of bits n11 to be set as an output value N_inv (step S935). On the other hand, if the number of bits n11 to be set is not larger than the number of bits n00 to be reset ("No" in step S934), the selector 632 selects the number of bits n00 to be reset as the output value N_inv (step S936).

Alternatively, steps S921 through S926 and steps S931 through S936 may be carried out in reverse order. As another alternative, these steps may be performed simultaneously in parallel, as shown in FIG. 5.

The comparator 641 compares the output value N_non_inv of the selector 631 with the output value N_inv of the selector 632. If the output value N_non_inv is larger than the output value N_inv ("Yes" in step S937), the comparator 641 determines that the write data is to be inverted (step S938). On the other hand, if the output value N_non_inv is not larger than the output value N_inv ("No" in step S937), the comparator 641 determines that the write data is not to be inverted (step S939).

Figure 10:
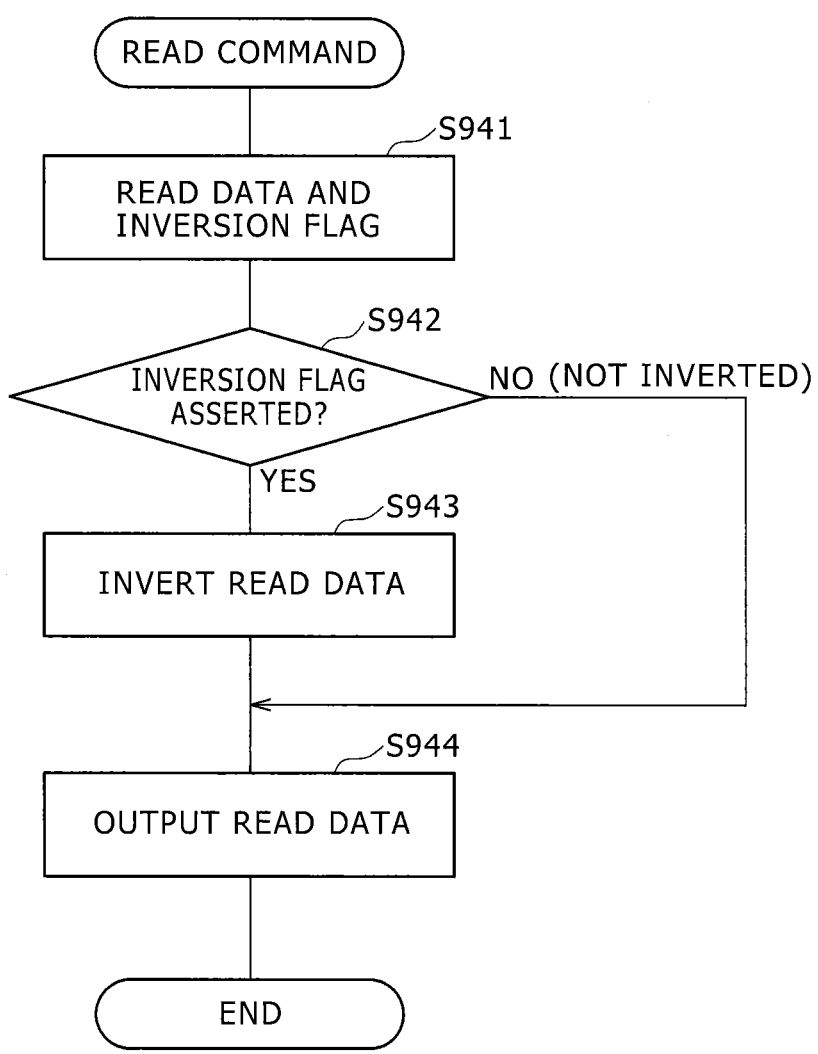
FIG. 10 is a flowchart showing a typical read procedure for the non-volatile memory in the first embodiment.

FIG. 10 is a flowchart showing a typical read procedure for the non-volatile memory 300 in the first embodiment of this disclosure.

When the processor 110 issues a read command, the read data and inversion flag are retrieved from that page in the memory cell array 310 which is indicated by a read address and are retained in the read buffer 340 (step S941). At this point, if the inversion flag is asserted in the read buffer 340 ("Yes" in step S942), the read data is inverted in the read buffer 340 (step S943). If the inversion flag is not asserted in the read buffer 340 ("No" in step S942), the read data is left intact. The read data held in the read buffer 340 is then output to the processor 110 (step S944).

According to the first embodiment described above, whether or not the write data is to be inverted can be determined appropriately by taking into account the consumption currents to be incurred upon state transition through comparison of the numbers of transitioning bits while the case of a set and that of a reset are distinguished from each other. With the determination performed in this manner, the numbers of bits to be set and reset in N-bit data can be reduced to N/2 bits in the worst case. In other words, if power consumption is the same as with the related art in the worst case, it is possible to access data twice as large in size during the same time period and thereby to make access speed twice as high.

2. Second Embodiment

In the above-described first embodiment, inversion determination and inversion control are carried out inside the non-volatile memory 300. In the second embodiment, inversion determination and inversion control are performed by the memory controller 200. The overall configuration of the information processing system is the same as explained above in reference to FIG. 1.

[Structure of the Memory Controller]

Figure 11:
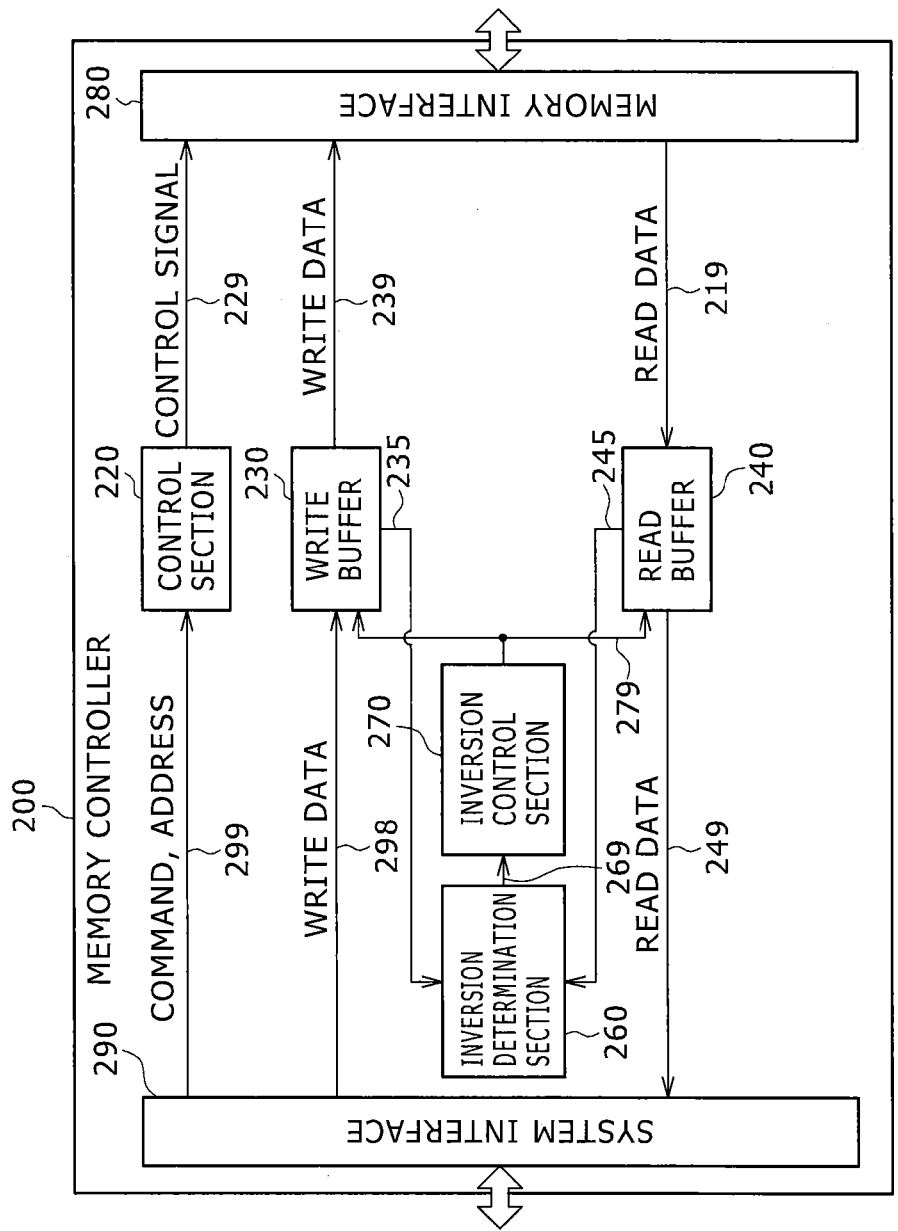
FIG. 11 is an illustration showing a typical structure of a memory controller in a second embodiment of the present disclosure.

FIG. 11 is an illustration showing a typical structure of the memory controller 200 in the second embodiment of the present disclosure. The memory controller 200 of the second embodiment includes a control section 220, a write buffer 230, a read buffer 240, an inversion determination section 260, an inversion control section 270, a memory interface 280, and a system interface 290.

The control section 220 is a controller that controls the blocks making up the memory controller 200. The control section 220 receives commands and addresses from the system interface 290 via a signal line 299, and outputs control signals to the memory interface 280 via a signal line 229.

The write buffer 230 holds write data for the memory cell array 310. The write buffer 230 receives write data from the system interface 290 via a signal line 298 and outputs the write data to the memory interface 280 via a signal line 239. The write data held in the write buffer 230 is supplied to the inversion determination section 260 via a signal line 235. In addition to the data, the write buffer 230 holds an inversion flag as in the memory cell array 310. Given instructions from the inversion control section 270, the write buffer 230 inverts the write data held therein and asserts the corresponding inversion flag to "1," for example.

The read buffer 240 holds read data retrieved from the memory cell array 310. The read buffer 240 receives read data from the memory interface 280 via a signal line 219 and outputs the read data to the system interface 290 via a signal line 249. The read data held in the read buffer 240 is supplied to the inversion determination section 260 via a signal line 245. In addition to the data, the read buffer 240 holds an inversion flag as in the memory cell array 310. Given instructions from the inversion control section 270, the read buffer 240 inverts the read data held therein and asserts the corresponding inversion flag to "1." It should be noted that the inversion operation is not carried out upon pre-read. Incidentally, the read buffer 240 is an example of the pre-read processing section described in the appended claims.

The inversion determination section 260 compares the read data held in the read buffer 240 with the write data retained in the write buffer 230 so as to determine whether or not to invert the write data kept in the write buffer 230. The result of the determination by the inversion determination section 260 is output to the inversion control section 270 via a signal line 269. The detailed processing by the inversion determination section 260 is the same as that carried out by the inversion determination section 360 explained in connection with the first embodiment.

In accordance with the result of the determination by the inversion determination section 260, the inversion control section 270 instructs the write buffer 230 or read buffer 240 to invert the data held therein via a signal line 279.

The memory interface 280 is an interface that exchanges data with the memory cell array 310. The system interface 290 is an interface that exchanges data with the processor 110.

[Structure of the Non-Volatile Memory]

Figure 12:
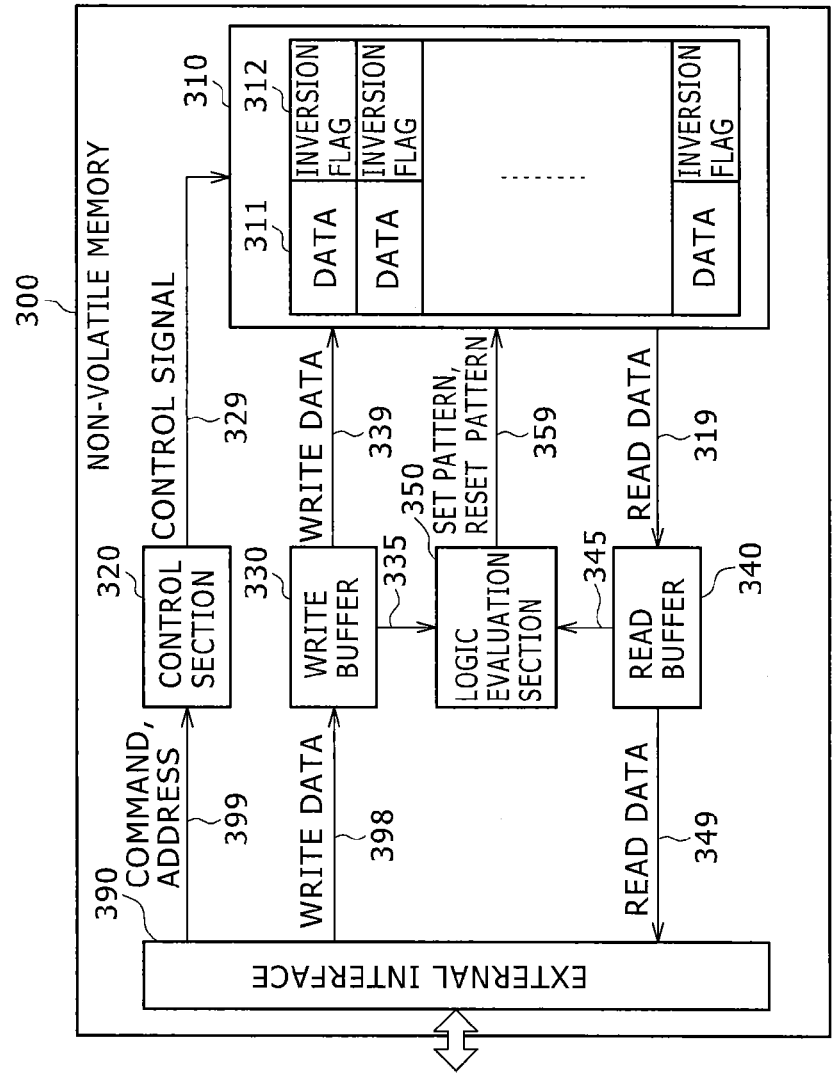
FIG. 12 is an illustration showing a typical structure of a non-volatile memory in the second embodiment.

FIG. 12 is an illustration showing a typical structure of the non-volatile memory 300 in the second embodiment of this disclosure. The non-volatile memory 300 of the second embodiment is equivalent to that of the first embodiment minus the inversion determination section 360 and inversion control section 370. Thus, in the write buffer 330 or read buffer 340, the data inversion operation is not performed. However, since the memory controller 200 carries out the inversion operation, the inversion flags 312 are still stored in the memory cell array 310 of the second embodiment.

[Operation of the Non-Volatile Memory]

Figure 13:
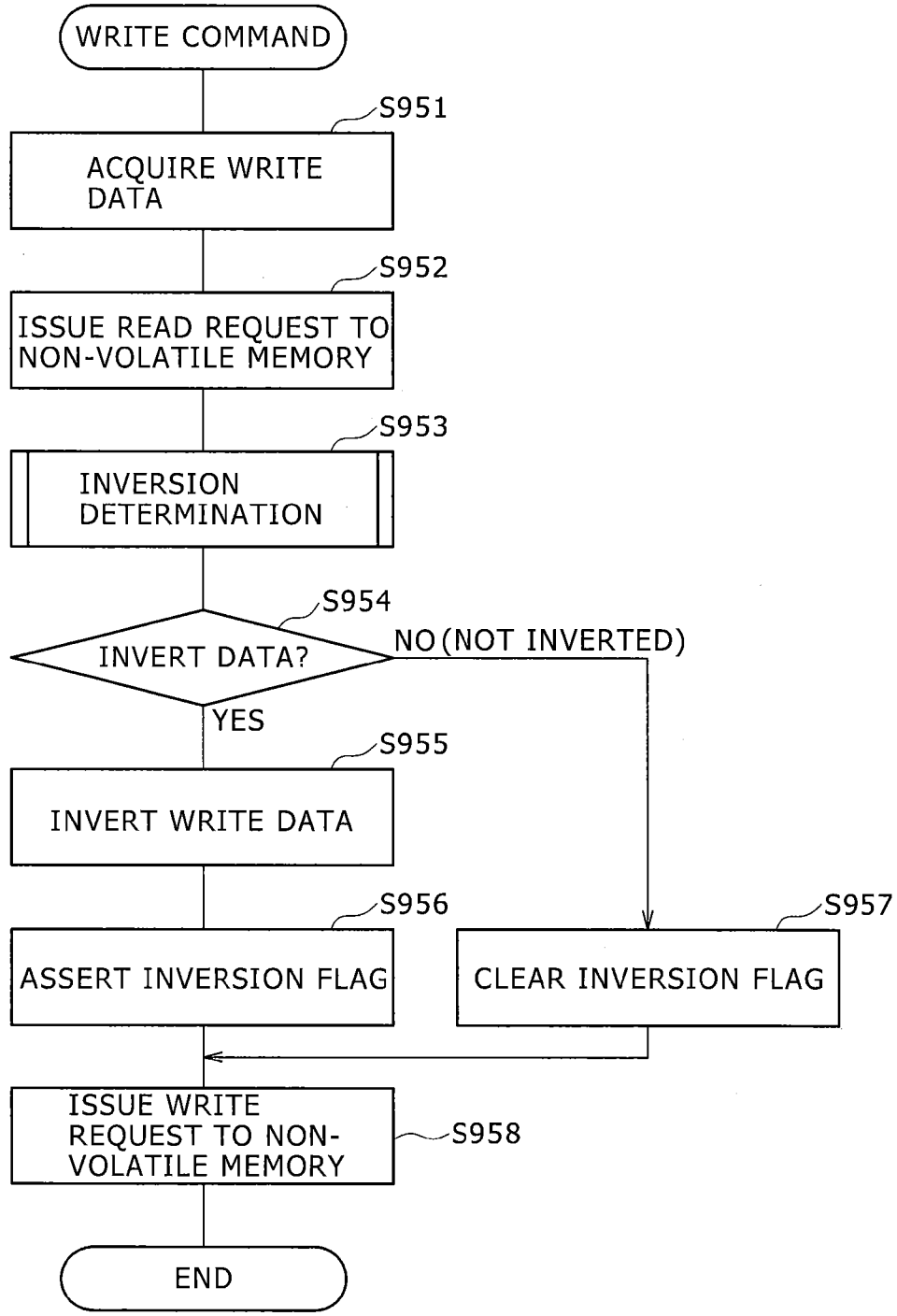
FIG. 13 is a flowchart showing a typical write procedure for the memory controller in the second embodiment.

FIG. 13 is a flowchart showing a typical write procedure for the memory controller 200 in the second embodiment of this disclosure.

When the processor 110 issues a write command, the write buffer 230 holds write data (step S951). The processor 110 also issues a read request to read data from that page in the memory cell array 310 which is indicated by a write address of the non-volatile memory 300, so that the read data and inversion flag are retrieved from the page as pre-read data and held in the read buffer 240 (step S952). At this point, if the inversion flag is asserted in the read buffer 240, the read data is inverted. The acquisition of write data and the pre-read process may be carried out in reverse order.

Based on the write data held in the write buffer 230 and on the pre-read data retained in the read buffer 240, the inversion determination section 260 determines whether or not to invert the write data in the write buffer 230 (step S953). The processing of step S953 is the same as that in FIGS. 8 and 9 explained above in connection with the first embodiment.

If it is determined consequently that the write data is to be inverted ("Yes" in step S954), the write data is inverted in the write buffer 230 (step S955) and the corresponding inversion flag is asserted (step S956). Alternatively, steps S955 and S956 may be carried out in reverse order. On the other hand, if it is determined that the write data is not to be inverted ("No" in step S954), the write data is left intact and the corresponding inversion flag is cleared (step S957).

Thereafter, the memory controller 200 issues a write request to write the write data held in the write buffer 230 to that page in the memory cell array 310 which is indicated by a write address of the non-volatile memory 300 (step S958).

Figure 14:
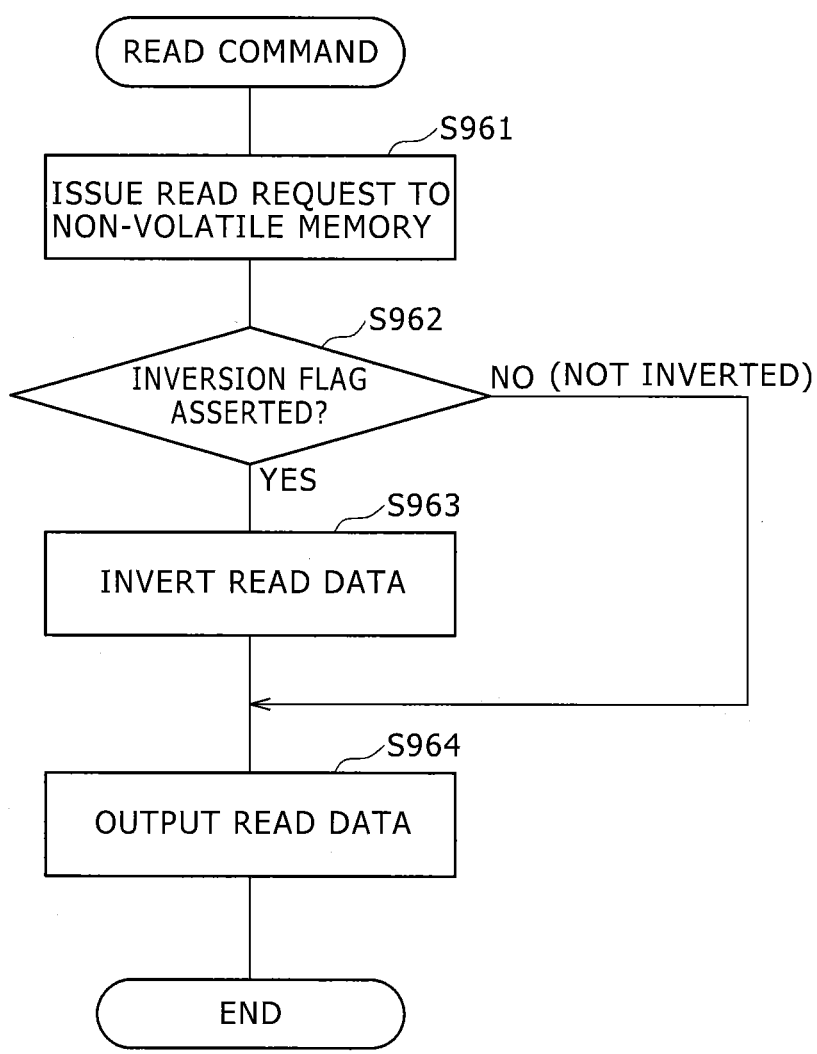
FIG. 14 is a flowchart showing a typical read procedure for the memory controller in the second embodiment.

FIG. 14 is a flowchart showing a typical read procedure for the memory controller 200 in the second embodiment of this disclosure.

When the processor 110 issues a read command, the memory controller 200 issues a read request to read data from that page in the memory cell array 310 which is indicated by a read address of the non-volatile memory 300 (step S961). With the read data placed in the read buffer 240 as a result, if the corresponding inversion flag is asserted ("Yes" in step S962), the read data is inverted in the read buffer 240 (step S963). If the inversion flag is not asserted ("No" in step S962), the read data is left intact. The read data retained in the read buffer 240 is then output to the processor 110 (step S964).

According to the second embodiment of this disclosure explained above, the inversion operation may be performed outside the non-volatile memory 300 based on the inversion determination carried out while the case of a set and that of a rest are distinguished from each other.

3. Third Embodiment

With the above-described first embodiment, it is determined which of the two kinds of write data is to be written: inverted or non-inverted write data. The third embodiment involves further generalizing this kind of determination to determine which of two candidates is to be written. The overall configuration of the information processing system is the same as explained above in reference to FIG. 1.

[Structure of the Non-Volatile Memory]

Figure 15:
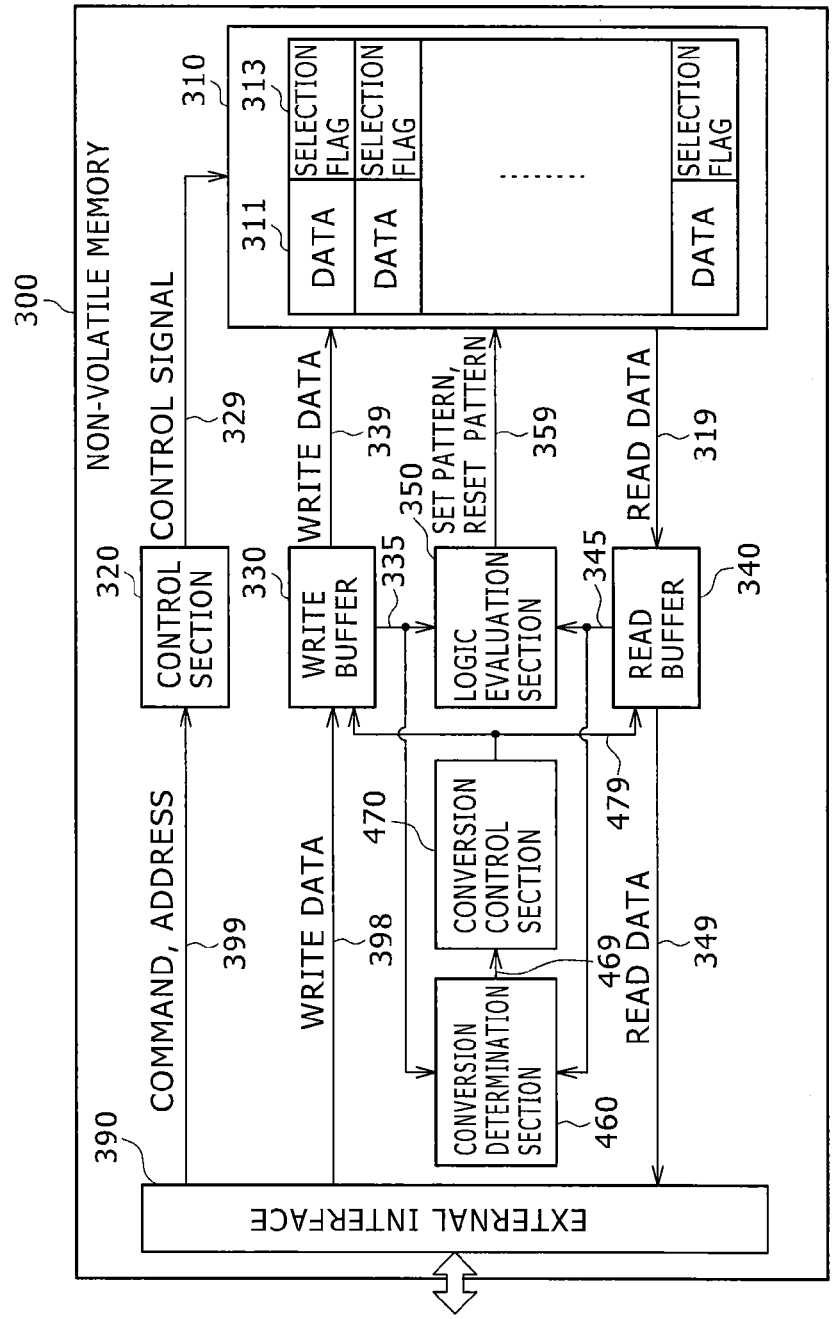
FIG. 15 is an illustration showing a typical structure of a non-volatile memory in a third embodiment of the present disclosure.

FIG. 15 is an illustration showing a typical structure of the non-volatile memory 300 in the third embodiment of the present disclosure. The non-volatile memory 300 includes a memory cell array 310, a control section 320, a write buffer 330, a read buffer 340, a logic evaluation section 350, a conversion determination section 460, a conversion control section 470, and an external interface (I/F) 390. The non-volatile memory 300 has basically the same structure as that of its counterpart in the first embodiment, except that write data undergoes one of two types of conversion before being written to the memory cell array 310. In the ensuing description, one of the two types of conversion will be referred to as "candidate 0" and the other as "candidate 1." Incidentally, the candidate 0 and candidate 1 are examples of the first and the second conversion candidates of write data described in the appended claims.

The memory cell array 310 is made up of a plurality of pages. Each of the pages stores data 311 and a selection flag 313. The data 311 is assumed to be 32-bit data constituting one word, for example. Each selection flag 313 indicates which of the two types of conversion has been selected for the corresponding data 311 stored in the memory cell array 310. As with the data 311, each selection flag 313 may represent either a "0" or a "1" as desired. For example, if the data 311 is stored with the conversion to the candidate 0 selected, the selection flag 313 may be cleared to "0"; if the data 311 is stored with the conversion to the candidate 1 selected, the selection flag 313 may be asserted to "1." The selection flag 313 is an example of the selection information described in the appended claims. Although a one-bit selection flag 313 is logically sufficient for one page of data 311, there may be provided a plurality of flag bits to improve reliability.

In addition to the data, the write buffer 330 holds the selection flag as in the memory cell array 310. Given instructions from the conversion control section 470, the write buffer 330 performs the selected one of the two types of conversion on the write data held therein and determines the selection flag reflecting the current status.

In addition to the data, the read buffer 340 holds the selection flag as in the memory cell array 310. Given instructions from the conversion control section 470, the read buffer 340 performs the reverse of the selected one of the two types of conversion on the read data held therein. It should be noted that this reverse conversion is not carried out upon pre-read. Incidentally, the read buffer 340 is an example of the pre-read processing section described in the appended claims.

The conversion determination section 460 compares the read data held in the read buffer 340 with the write data retained in the write buffer 330 so as to determine which of the two types of conversion is to be performed on the write data kept in the write buffer 330. The result of the determination by the conversion determination section 460 is output to the conversion control section 470 via a signal line 469. The detailed processing by the conversion determination section 460 will be discussed later.

In accordance with the determination result from the conversion determination section 460, the conversion control section 470 instructs the write buffer 330 or read buffer 340 to perform one of the two types of conversion on the data held therein via a signal line 479.

[Structure of the Conversion Determination Section]

Figure 16:
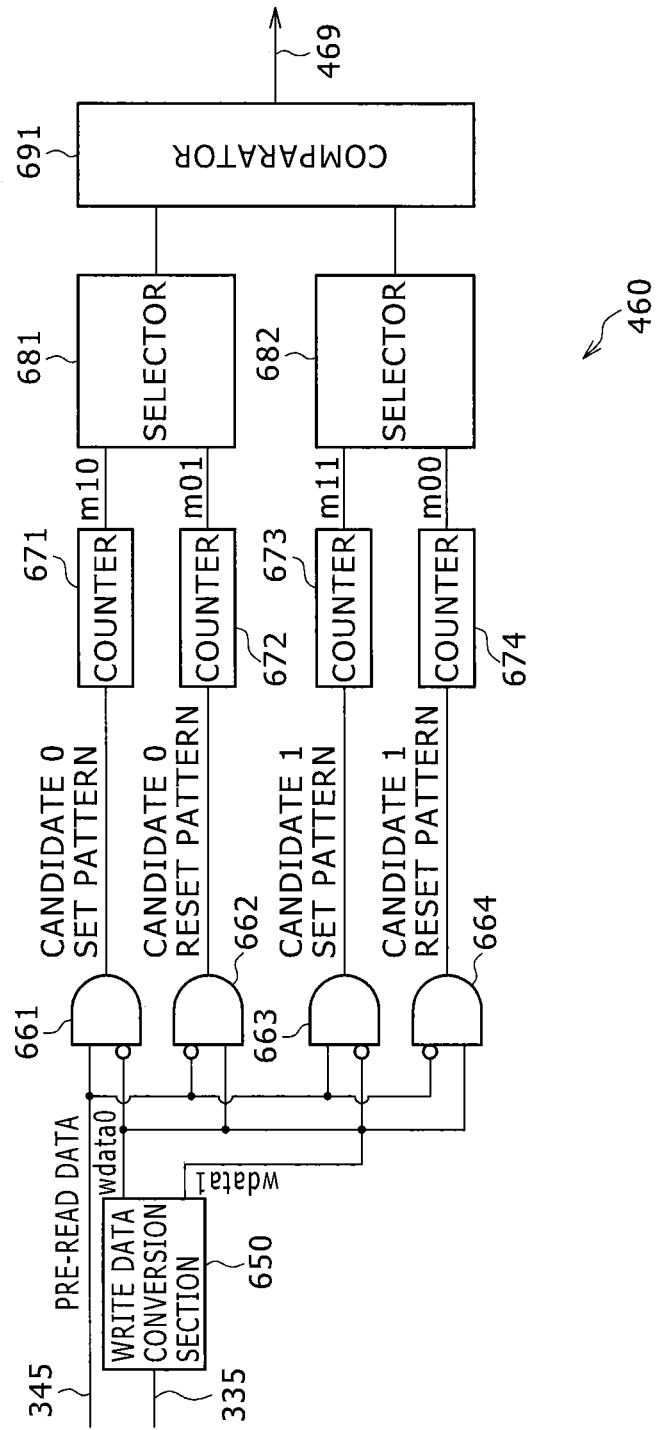
FIG. 16 is an illustration showing a typical structure of a conversion determination section in the third embodiment.

FIG. 16 is an illustration showing a typical structure of the conversion determination section 460 in the third embodiment of this disclosure. The read data (pre-read data) held in the read buffer 340 is input to the conversion determination section 460 via the signal line 345, and the write data retained in the write buffer 330 is input to the conversion determination section 460 via the signal line 335. It is assumed here that the pre-read data and write data are input one corresponding bit at a time. Alternatively, a plurality of bits may be input in parallel and counted collectively. For example, 32-bit write data and 32-bit pre-read data may be input collectively to generate a 32-bit pattern in which the bits set to "1" each are counted. The conversion determination section 460 includes a write data conversion section 650, logic gates 661 through 664, counters 671 through 674, selectors 681 and 682, and a comparator 691. Incidentally, the logic gates 661 through 664 are an example of the detector described in the appended claims.

The write data conversion section 650 performs one of the two types of conversion on the write data input via the signal line 335. It is assumed here that the data having undergone conversion to the candidate 0 and the data having undergone conversion to the candidate 1 are referred to as wdata0 and wdata1, respectively. Specific examples of the candidates 0 and 1 will be discussed later.

The logic gate 661 detects a bit of which the transition of pre-read data to the candidate 0 of write data is from "1" to "0," i.e., the bit to be set upon conversion of write data to the candidate 0. The counter 671 counts the number of bits detected by the logic gate 661. A value m10 counted by the counter 671 represents the number of bits to be set upon conversion of write data to the candidate 0.

The logic gate 662 detects a bit of which the transition of pre-read data to the candidate 0 of write data is from "0" to "1," i.e., the bit to be reset upon conversion of write data to the candidate 0. The counter 672 counts the number of bits detected by the logic gate 662. A value m01 counted by the counter 672 represents the number of bits to be reset upon conversion of write data to the candidate 0.

The logic gate 663 detects a bit of which the transition of pre-read data to the candidate 1 of write data is from "1" to "0," i.e., the bit to be set upon conversion of write data to the candidate 1. The counter 673 counts the number of bits detected by the logic gate 663. A value m11 counted by the counter 673 represents the number of bits to be set upon conversion of write data to the candidate 1.

The logic gate 664 detects a bit of which the transition of pre-read data to the candidate 1 of write data is from "0" to "1," i.e., the bit to be reset upon conversion of write data to the candidate 1. The counter 674 counts the number of bits detected by the logic gate 664. A value m00 counted by the counter 674 represents the number of bits to be reset upon conversion of write data to the candidate 1.

The selector 681 selects the larger of two values: the value m10 output from the counter 671 or the value m01 from the counter 672. That is, the selector 681 outputs the larger of the two bit counts: the number of transitioning bits to be set or the number of transitioning bits to be reset upon conversion of write data to the candidate 0.

The selector 682 selects the larger of two values: the value m11 output from the counter 673 or the value m00 from the counter 674. That is, the selector 682 outputs the larger of the two bit counts: the number of transitioning bits to be set or the number of transitioning bits to be reset upon conversion of write data to the candidate 1.

The comparator 691 compares the output of the selector 681 with that of the selector 682 to output the smaller of the two compared values as the result of determination via the signal line 469. That is, if the output of the selector 681 is the smaller of the two values compared, the comparator 691 gives a determination result indicating that the write data is to be converted to the candidate 0; if the output of the selector 682 is the smaller of the two values, the comparator 691 gives a determination result indicating that the write data is to be converted to the candidate 1. If the two selectors 681 and 682 provide the same output, the comparator 691 may give either of the two determination results.

Figure 17:
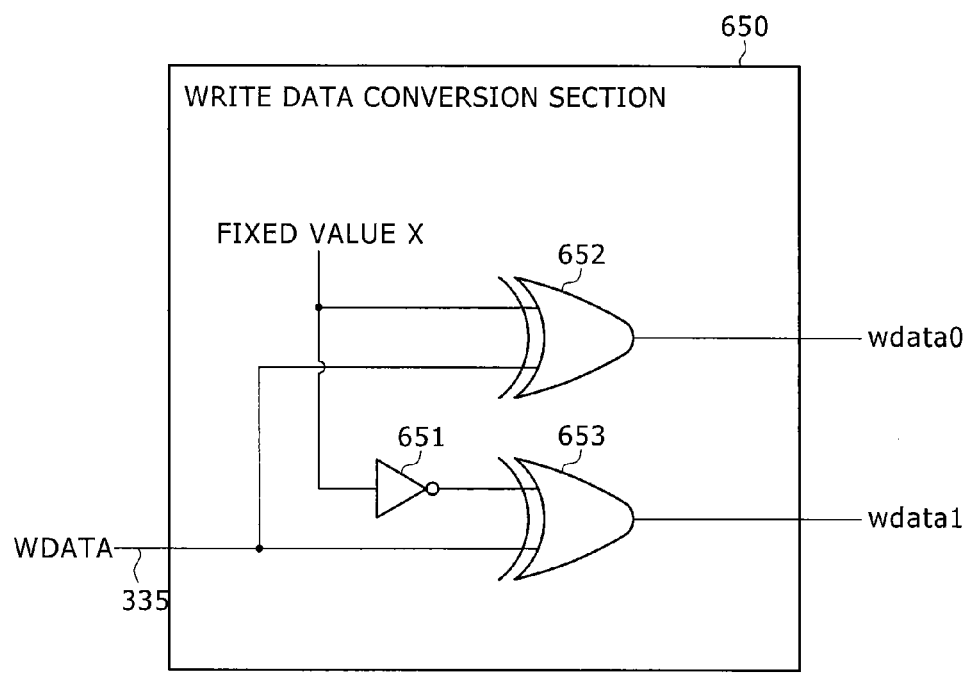
FIG. 17 is an illustration showing a typical structure of a write data conversion section in the third embodiment.

FIG. 17 is an illustration showing a typical structure of the write data conversion section 650 in the third embodiment of this disclosure. Whereas the write data conversion section 650 is assumed to be included in the conversion determination section 460, a similar section may also be used for the write buffer 330.

The write data conversion section 650 generates a value wdata0 through conversion to the candidate 0 and a value wdata1 through conversion to the candidate 1 from write data WDATA input from the write buffer 330 via the signal line 335. In this example, an exclusive-OR of the write data WDATA and of a fixed value X is generated as the value wdata0 of the candidate 0. For this purpose, the write data conversion section 650 is furnished with an exclusive-OR gate 652 that generates the exclusive-OR of the write data WDATA and of the fixed value X. Also, an exclusive-OR of the write data WDATA and of the inverted value of the fixed value X is generated as the value wdata1 of the candidate 1. For this purpose, the write data conversion section 650 is provided with an inverting gate 651 and an exclusive-OR gate 653. The inverting gate 651 inverts the fixed value X, before the exclusive-OR gate 653 generates an exclusive-OR of the write data WDATA and of the inverted value of the fixed value X. If the fixed value X is assumed to be entirely composed of 0's in this example, the same result as that of the first embodiment is obtained. That is, the candidate 0 is the write data itself (non-inverted) and the candidate 1 is the inverted write data.

Where the candidates 0 and 1 for conversion are generated from write data, reversibility is required for the conversion with this embodiment. Reversibility refers to the ability to restore the original write data from the converted write data through reverse conversion. When the candidates 0 and 1 are generated through the exclusive-OR operation performed on the fixed value X or its inverted value and on the write data as discussed above, the original write data can be restored by again carrying out the same exclusive-OR operation. The conversion is thus to have reversibility.

Also with this embodiment, it is necessary for at least either of the candidates 0 and 1 to be such that the number of bits to be set and the number of bits to be reset are each half or less of the total number of bits. In the example involving the write data conversion section 650, the candidates 0 and 1 are complementary to each other; when one candidate is "0," the other is "1." That means the number of bits to be set and the number of bits to be reset are each half or less of the total number of bits involved.

Figure 18:
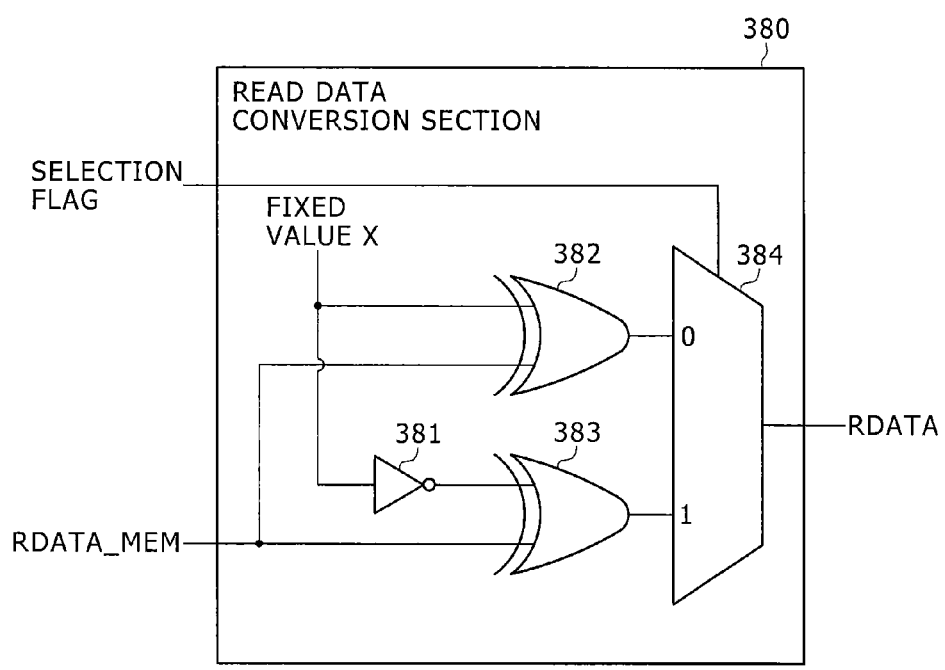
FIG. 18 is an illustration showing a typical structure of a read data conversion section in the third embodiment.

FIG. 18 is an illustration showing a typical structure of a read data conversion section 380 in the third embodiment of this disclosure. The read data conversion section 380 is used for the read buffer 340.

The read data conversion section 380 generates read data RDATA through reverse conversion of the read data RDATA_MEM from the candidate 0 or 1 and the selection flag following retrieval from the memory cell array 310. In this example, the read data conversion section 380 is furnished with an exclusive-OR gate 382 that generates an exclusive OR of the read data RDATA_MEM and of the fixed value X. Also, the read data conversion section 380 is provided with an inverting gate 381 and an exclusive-OR gate 383. The inverting gate 381 inverts the fixed value X, before the exclusive-OR gate 383 generates the exclusive-OR of the read data RDATA_MEM and of the inverted value of the fixed value X. The read data conversion section 380 is further provided with a selector 384 that selects the output of either the exclusive-OR gate 382 or the exclusive-OR gate 383 in accordance with the selection flag read from the memory cell array 310, whereby the read data RDATA is obtained.

The foregoing paragraphs have explained examples in which the candidates 0 and 1 are generated through the exclusive-OR operation performed on the fixed value X or its inverted value and on the write data. Alternatively, other conversion candidates may be utilized as long as reversibility and complementarity are ensured as discussed above. For example, bit transposition, bit shift or the like may be used singly or in combination with other kinds of conversion.

[Conversion Using Tables]

With the above-explained embodiment, hardware circuits are used to generate the conversion candidates 0 and 1. Alternatively, a table look-up may be used in generating the conversion candidates. The table look-up arrangement permits more flexible setting of conversion candidates. However, to establish the values of the table requires that the following two conditions be met:

(1) Condition 1: The write data WDATA and the value wdata0 of the candidate 0, as well as the write data WDATA and the value wdata1 of the candidate 1, should correspond to each other on a one-to-one basis. That is, the value wdata0 of the candidate 0 should be determined uniquely for the write data WDATA, and the write data WDATA should be determined uniquely for the value wdata0 of the candidate 0. The same should apply to the value wdata1 of the candidate 1.

(2) Condition 2: In at least either the value wdata0 of the candidate 0 or the value wdata1 of the candidate 1, the number of bits to be set and the number of bits to be reset should each be half or less of the total number of bits involved.

FIG. 19 is an illustration showing how a table look-up is typically used in generating conversion candidates with the third embodiment of this disclosure. For purpose of simplification and illustration with this example, 16 bit patterns are shown derived from a four-bit data width assumed for the target write data.

In this example, the value wdata0 of the candidate 0 is the non-inverted value of the write data WDATA. The value wdata1 of the candidate 1 is the inverted value of the write data WDATA for the zeroth pattern and for the third through the 15th patterns. With the first pattern, the value wdata1 of the candidate 1 is the inverted value of the write data WDATA shifted one bit left. With the second pattern, the value wdata1 of the candidate 1 is the inverted value of the write data WDATA shifted one bit right. In this case, the above-mentioned reversibility and complementarity are also ensured.

Described below is how the two conditions mentioned above are met in this example of table look-up. First, for the zeroth pattern and for the third through the 15th patterns, the value wdata0 is the non-inverted value of the write data WDATA and the value wdata1 is the inverted value of the write data WDATA, which shows reversibility and complementarity to be ensured. In addition, for the first and the second patterns, the original write data can be restored through inversion and shift operations, which also shows reversibility to be ensured. Although the first and the second patterns are devoid of complementarity, the number of bits to be set and the number of bits to be reset are each half or less of the total number of bits involved, as will be shown later.

FIG. 20 summarizes the number of bits to be set and the number of bits to be reset in the first pattern of the example in FIG. 19. As shown in FIG. 20, examining the number of bits to be set and the number of bits to be reset in each of the patterns of the pre-read data reveals that at least either of the values wdata0 and wdata1 is two bits or less with regard to any pre-read data. That is, in at least either of the values wdata0 and wdata1, the number of bits to be set and the number of bits to be reset are each half or less of the total number of bits involved.

FIG. 21 summarizes the number of bits to be set and the number of bits to be reset in the second pattern of the example in FIG. 19. As shown in FIG. 21, examining the number of bits to be set and the number of bits to be reset in each of the patterns of the pre-read data reveals that at least either of the values wdata0 and wdata1 is two bits or less regarding any pre-read data. That is, in at least either of the values wdata0 and wdata1, the number of bits to be set and the number of bits to be reset are each half or less of the total number of bits involved.

It is shown above that the example of FIG. 19 has reversibility and that in at least either of the values wdata0 and wdata1, the number of bits to be set and the number of bits to be reset are each half or less of the total number of bits involved. This example thus meets the requirements of the third embodiment.

FIG. 22 is an illustration showing how a table look-up is typically used for reverse conversion with the third embodiment of this disclosure. This example is the reverse of what is shown in FIG. 19 as the example of conversion. In this case, as with the read data conversion section 380, the read data RDATA having undergone reverse conversion from the candidate 0 or 1 is generated from the read data RDATA_MEM and the selection flag following retrieval from the memory cell array 310. That is, the column of rdata0 or rdata1 in the table is selected depending on which candidate is indicated by the selection flag. A search is then made through the selected column for the row that matches the read data RDATA_MEM, and the read data RDATA corresponding to the matching row is output.

[Operation of the Non-Volatile Memory]

Figure 23:
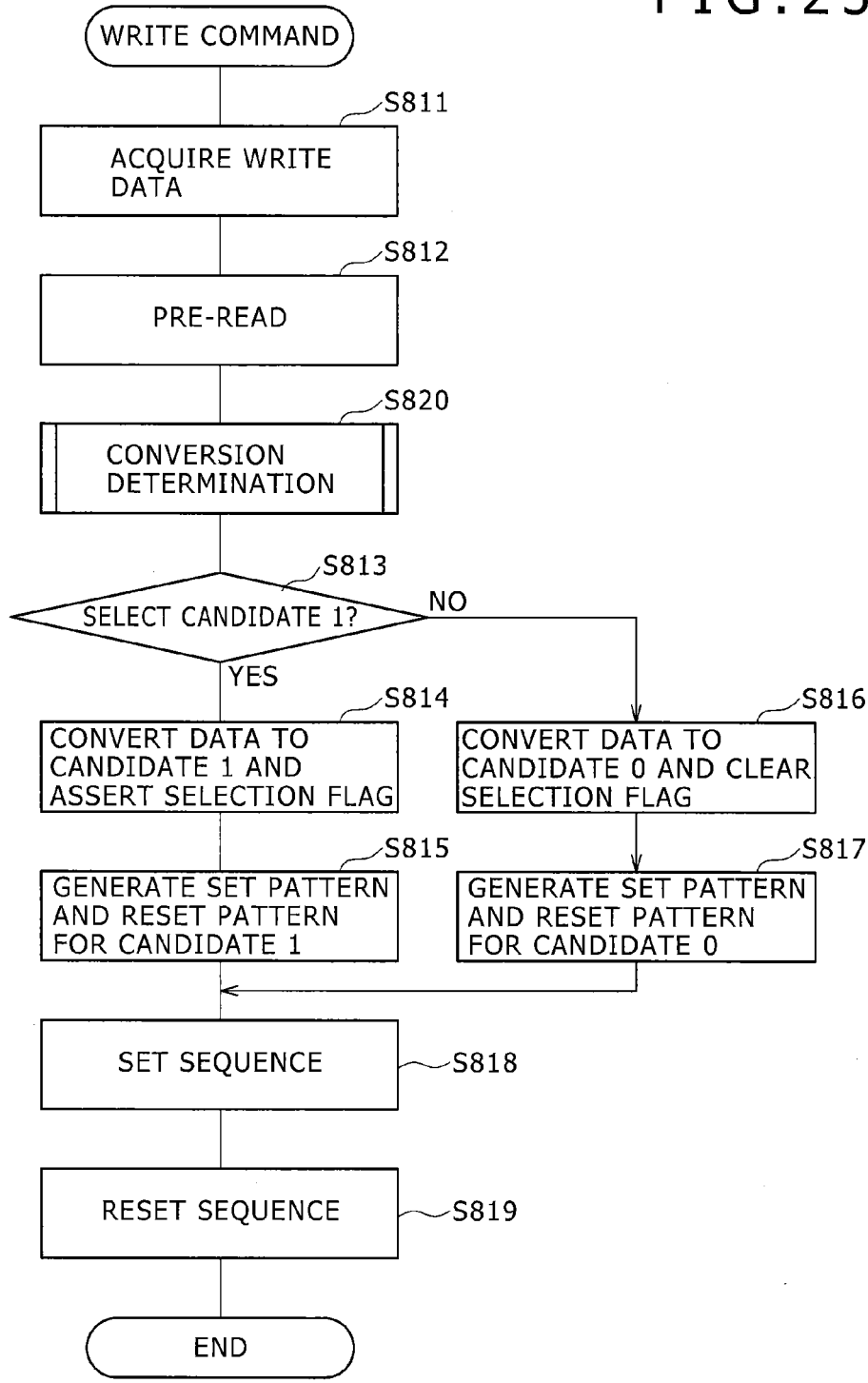
FIG. 23 is a flowchart showing a typical write procedure for the non-volatile memory in the third embodiment.

FIG. 23 is a flowchart showing a typical write procedure for the non-volatile memory 300 in the third embodiment of this disclosure.

When the processor 110 issues a write command, write data is placed into the write buffer 330 (step S811). In addition, read data and a selection flag are read as a pre-read data from that page in the memory cell array 310 which is indicated by a write address, and are retained in the read buffer 340 (step S812). The acquisition of the write data and the pre-read process may be carried out in reverse order.

Based on the write data held in the write buffer 330 and on the pre-read data retained in the read buffer 340, the conversion determination section 460 determines which of the candidates 0 and 1 the write data in the write buffer 330 is to be converted to (step S820). If it is determined consequently that the write data is to be converted to the candidate 1 ("Yes" in step S813), the write data is converted to the candidate 1 and the corresponding selection flag is asserted to "1" in the write buffer 330 (step S814). In this case, the logic evaluation section 350 generates a set pattern and a reset pattern for the candidate 1 (step S815).

On the other hand, if it is determined that the write data is to be converted to the candidate 0 ("No" in step S813), the write data is converted to the candidate 0 and the corresponding selection flag is cleared to "0" in the write buffer 330 (step S816). In this case, the logic evaluation section 350 generates a set pattern and a reset pattern for the candidate 0 (step S817).

Alternatively, instead of being generated in step S817, the set and reset patterns for the candidate 0 may be generated in step S823 of FIG. 24 (to be discussed later) detailing step S820. Also, instead of being generated in step S815, the set and reset patterns for the candidate 1 may be generated in step S833 of FIG. 25 (to be discussed later) detailing step S820.

Thereafter, in accordance with the generated set pattern, a set operation is carried out to perform state transition from HRS to LRS (step S818). In addition, in keeping with the generated reset pattern, a reset operation is carried out to perform state transition from LRS to HRS (in step S819). The set operation and the reset operation may be carried out in reverse order.

Figure 24:
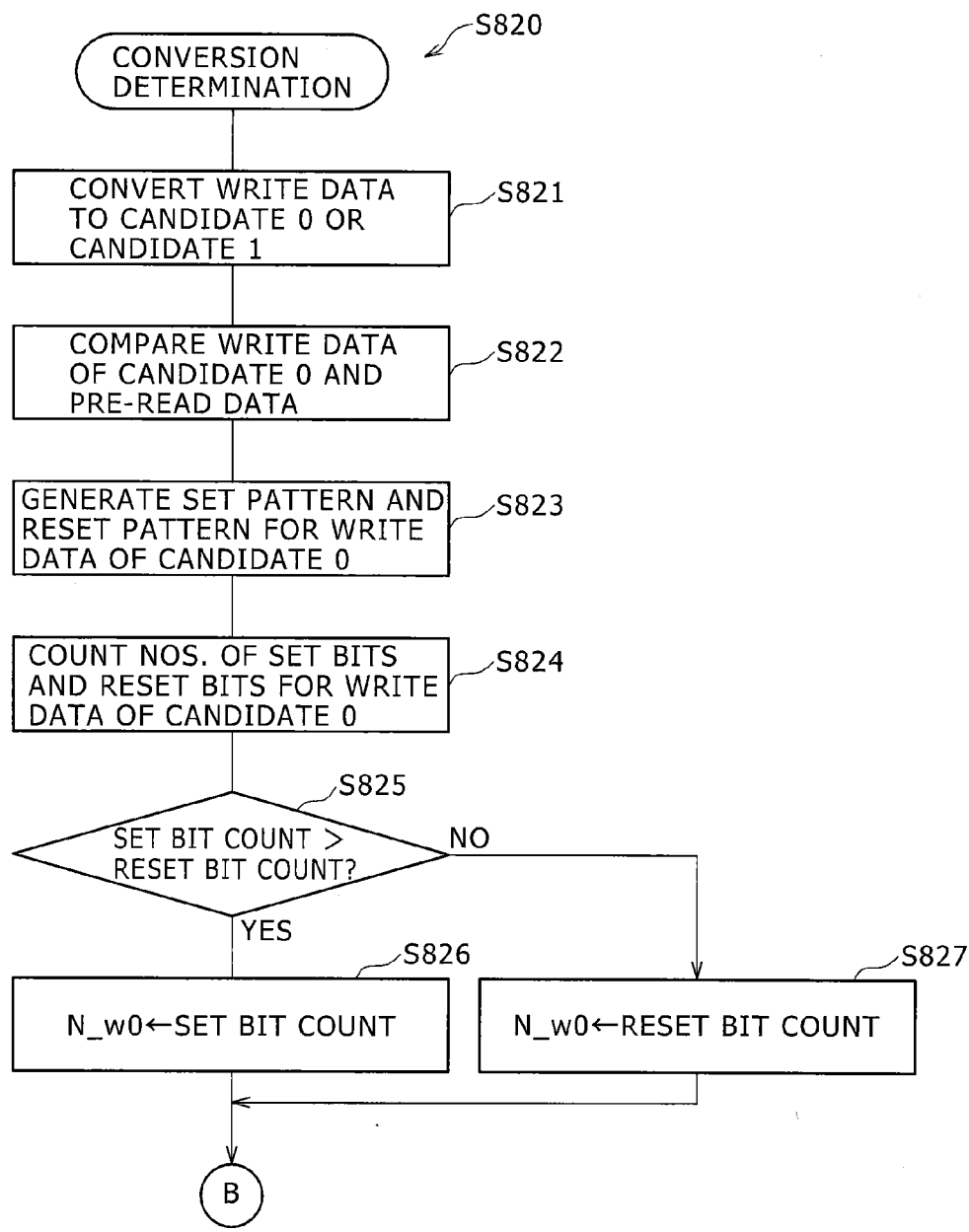
FIG. 24 is a flowchart showing the first half of a typical procedure for a conversion determination process with the third embodiment.
Figure 25:
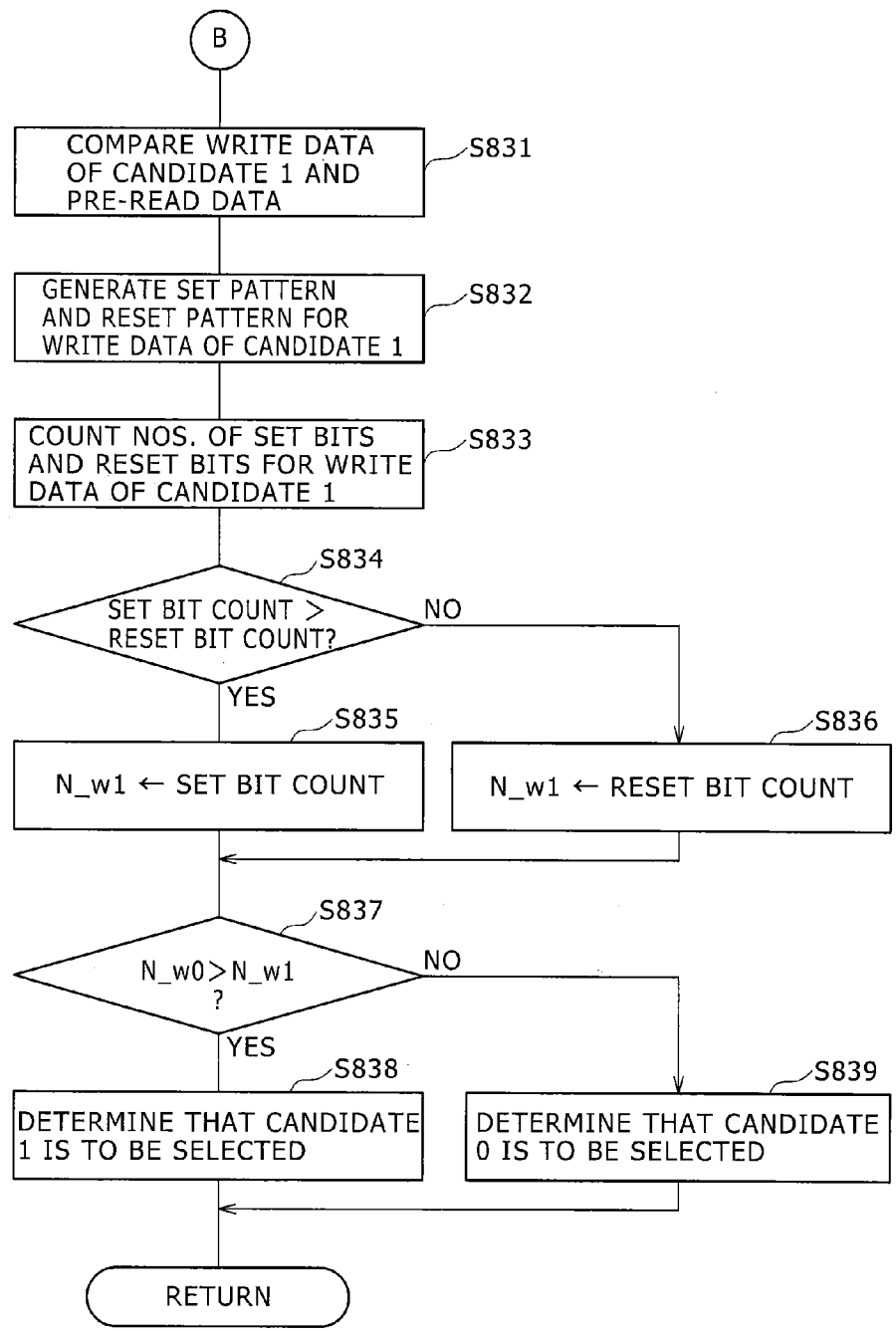
FIG. 25 is a flowchart showing the second half of the typical procedure for the conversion determination process with the third embodiment.

FIGS. 24 and 25 are flowcharts of a typical procedure for the conversion determination process (step S820) with the third embodiment of this disclosure.

First, the write data conversion section 650 converts the write data WDATA to the candidates 0 and 1 so as to generate the values wdata0 and wdata1, respectively (step S821).

The logic gates 661 and 662 compare the write data of the candidate 0 and the pre-read data (step S822) so as to generate a set pattern and a reset pattern for the candidate 0 (step S823), respectively. In addition, the counters 671 and 672 count the number of bits m10 to be set and the number of bits m01 to be reset for the candidate 0, respectively (step S824).

If it is determined consequently that the number of bits m10 to be set is larger than the number of bits m01 to be reset ("Yes" in step S825), the selector 681 selects the number of bits m10 to be set as an output value N_w0 (step S826). On the other hand, if it is determined that the number of bits m10 to be set is not larger than the number of bits m01 to be reset ("No" in step S825), the selector 681 selects the number of bits m01 to be reset as the output value N_w0 (step S827).

The logic gates 663 and 664 compare the write data of the candidate 1 and the pre-read data (step S831) so as to generate a set pattern and a reset pattern for the candidate 1 (step S832), respectively. In addition, the counters 673 and 674 count the number of bits m11 to be set and the number of bits m00 to be reset for the candidate 1, respectively (step S833).

If it is determined consequently that the number of bits m11 to be set is larger than the number of bits m00 to be reset ("Yes" in step S834), the selector 682 selects the number of bits m11 to be set as an output value N_w1 (step S835). On the other hand, if it is determined that the number of bits m11 to be set is not larger than the number of bits m00 to be reset ("No" in step S834), the selector 682 selects the number of bits m00 to be reset as the output value N_w1 (step S836).

Incidentally, steps S821 through S827 and steps S831 through S836 may be carried out in reverse order. These steps may also be performed simultaneously and in parallel, as shown in FIG. 16.

The comparator 691 compares the output value N_w0 from the selector 681 with the output value N_w1 from the selector 682. If the output N_w0 is larger than the output value N_w1 ("Yes" in step S837), the comparator 691 determines that the candidate 1 is to be selected (step S838). If the output N_w0 is not larger than the output value N_w1 ("No" in step S837), the comparator 691 determines that the candidate 0 is to be selected (step S839).

Figure 26:
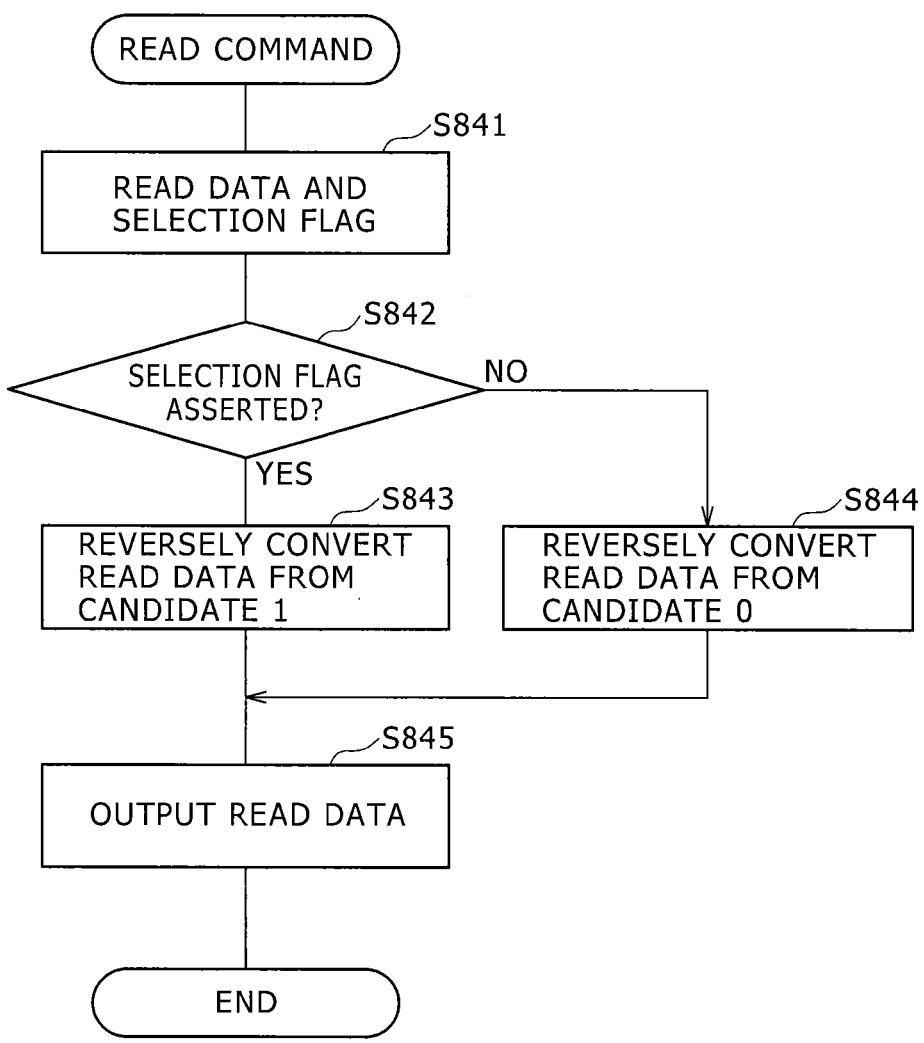
FIG. 26 is a flowchart showing a typical read procedure for the non-volatile memory in the third embodiment.

FIG. 26 is a flowchart showing a typical read procedure for the non-volatile memory 300 in the third embodiment of this disclosure.

When the processor 110 issues a read command, read data and a selection flag are read from that page in the memory cell array 310 which is indicated by a read address. The read data and selection flag are placed into the read buffer 340 (step S841). At this point, if the selection flag in the read buffer 340 is asserted ("Yes" in step S842), the read data in the read buffer 340 is reversely converted from the candidate 1 (step S843). If the selection flag is not asserted ("No" in step S842), the read data in the read buffer 340 is reversely converted from the candidate 0 (step S844). The read data held in the read buffer 340 is then output to the processor 110 (step S845).

According to the third embodiment explained above, the numbers of transitioning bits are evaluated while the case of a set and that of a reset are distinguished from each other. This makes it possible to determine the appropriate type of conversion to be performed on the write data while the consumption currents to be incurred upon state transition are taken into consideration. With the determination performed in this manner, the number of bits to be set and reset in N-bit data can be reduced to N/2 bits in the worst case. In other words, if power consumption is the same as with the related art in the worst case, it is possible to access data twice as large in size during the same time period and thereby to make access speed twice as high.

[Variations]

Figure 27:
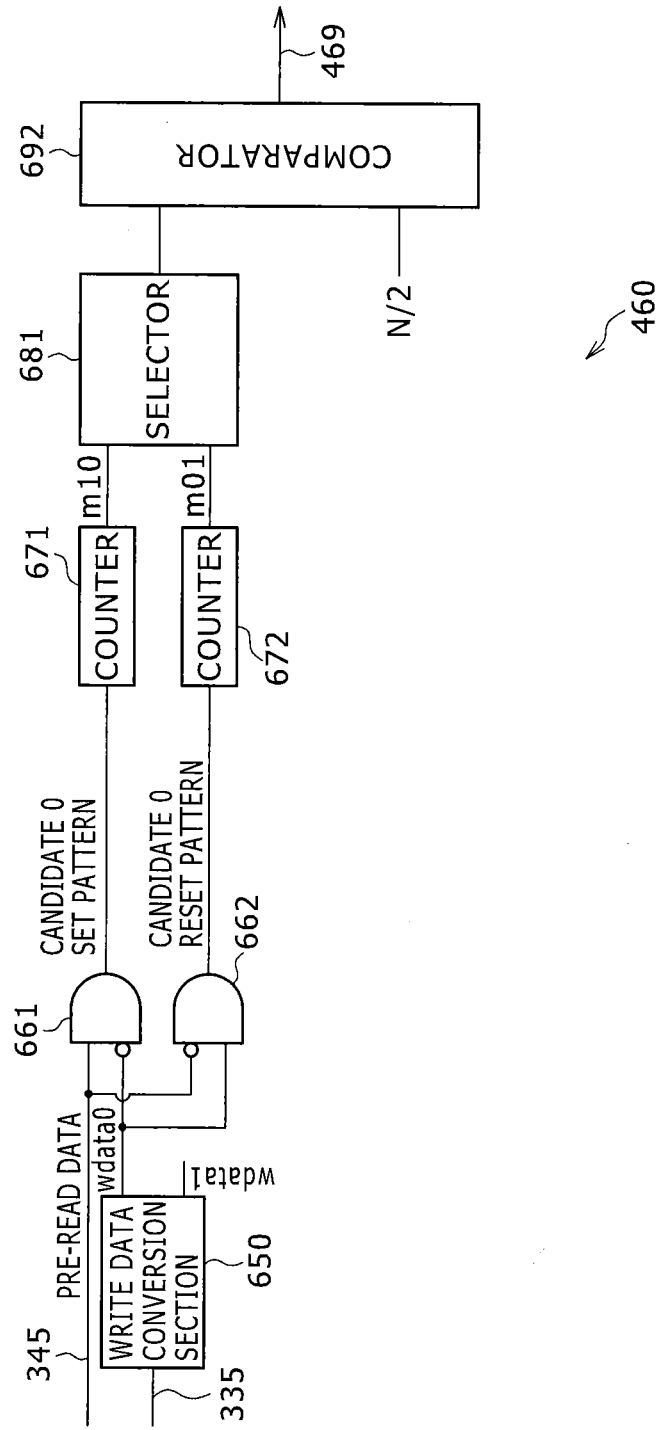
FIG. 27 is an illustration showing a variation of the conversion determination section in the third embodiment.

FIG. 27 is an illustration showing a variation of the conversion determination section 460 in the third embodiment of this disclosure. Compared with what was explained in reference to FIG. 16, this variation of the conversion determination section 460 is devoid of the logic gates 663 and 664, counters 673 and 674, and selector 682. Whereas the output of the selector 682 is connected to one input of the comparator 691, half the entire bit count N (N/2) is input to one input of the comparator 692 in this variation. That is because the appropriate selection can be made by evaluating only one of the two candidates on the assumption that the number of bits to be set or reset in either of the candidates 0 and 1 is half or less of the total number of bits involved. That is, if the output of the selector 681 is larger than N/2, the candidate 1 is selected; if the output of the selector 681 is smaller than N/2, the candidate 0 is selected. If the output of the selector 681 is the same as N/2, either of the two candidates may be selected.

Figure 28:
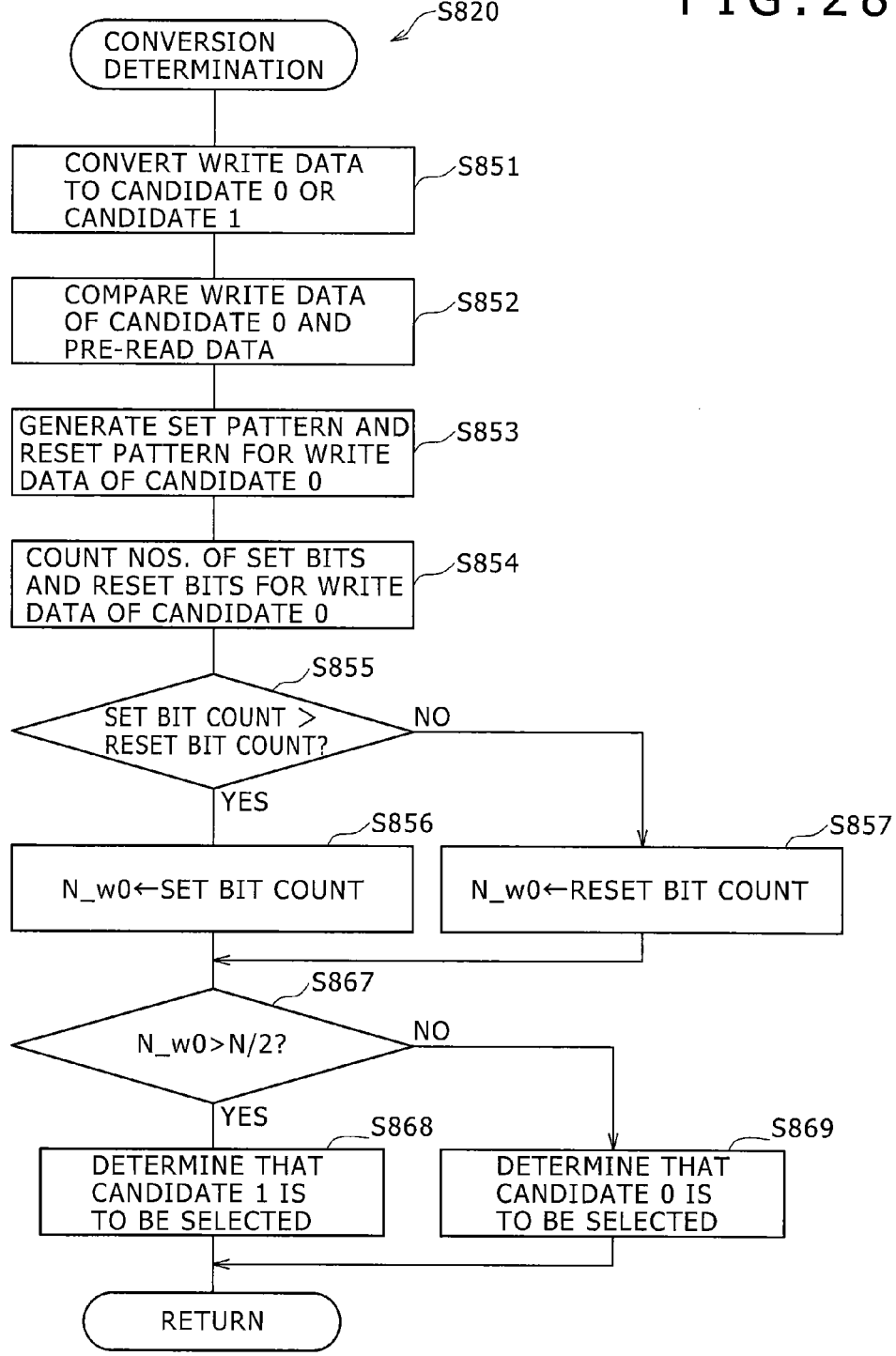
FIG. 28 is a flowchart showing an alternative procedure for the conversion determination process with the third embodiment.

FIG. 28 is a flowchart showing an alternative procedure for the conversion determination process (i.e., step S820) with the third embodiment of this disclosure. In this alternative, steps S851 through S857 are substantially the same as steps S821 through S827 explained above in reference to FIG. 24.

The comparator 692 compares the output value N_w0 from the selector 681 with N/2. If the output value N_w0 is larger than N/2 ("Yes" in step S867), the comparator 692 determines that the candidate 1 is to be selected (step S868). If the output value N_w0 is not larger than N/2 ("No" in step S867), the comparator 692 determines that the candidate 0 is to be selected (step S869).

According to the variation of the third embodiment explained above, the number of bits to be set or reset need only be determined with regard to either of the candidates 0 and 1. This appreciably simplifies the conversion determination process. Whereas the third embodiment involves making the determination in a manner minimizing the number of bits to be set or reset, the above variation is sufficient to make the bit count N/2 or less. Although only the candidate 0 is targeted in determining the number of bits to be set or reset in the above example, the candidate 1 alone can obviously be targeted instead.

Whereas the third embodiment was explained above as having conversion control performed, for example, by the non-volatile memory 300, conversion control may be carried out alternatively by the memory controller 200 as with the second embodiment.

The embodiments and their variations described above are merely examples in which the present disclosure may be implemented. The particulars of the embodiments and their variations in the description of the preferred embodiments of this specification correspond basically to the disclosed matters claimed in the appended claims. Likewise, the disclosed matters named in the appended claims correspond basically to the particulars with the same names in the description of the preferred embodiments. However, these embodiments and their variations and other examples of the present disclosure are not limitative thereof, and it should be understood by those skilled in the art that various modifications, combinations, sub-combinations and alterations may occur depending on design requirements and other factor in so far as they are within the scope of the appended claims or the equivalents thereof.

Also, the series of the steps and processes discussed above as part of the embodiments may be construed as a method for carrying out such steps and processes, as a program for causing a computer to execute such a method, or as a recording medium that stores such a program. As the recording medium, any of such media as CD (Compact Disc), MD (MiniDisc), DVD (Digital Versatile Disk), a memory card, and a Blu-ray Disc (registered trademark) may be used.

The technology disclosed by the present disclosure may also be configured as follows:

(1) A memory control apparatus including:
a pre-read processing section configured to read pre-read data from a data area to be written to before a write process in a predetermined data area of a memory cell array holding either a first value or a second value per bit;
a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and
a conversion control section configured to select either the first conversion candidate or the second conversion candidate in accordance with the determination result while outputting selection information indicative of which of the two candidates has been selected.

(2) A memory control apparatus including:
a pre-read processing section configured to read pre-read data from a data area to be written to before a write process in a predetermined data area of a memory cell array holding either a first value or a second value per bit;
a conversion determination section configured to generate a determination result for selectively allowing the pre-read data to transition to either a first conversion candidate or a second conversion candidate of the write data to be written in the write process through comparison of two values, one of the two values compared being the larger of two values of which one is the number of bits transitioning from the first value to the second value and of which the other is the number of bits transitioning from the second value to the first value upon transition of the pre-read data to the first conversion candidate, the other of the two values compared being the larger of two values of which one is the number of bits transitioning from the first value to the second value and of which the other is the number of bits transitioning from the second value to the first value upon transition of the pre-read data to the second conversion candidate, the selection of either the first conversion candidate or the second conversion candidate being made in such a manner that the number of transitioning bits is the smaller of the two numbers compared; and
a conversion control section configured to select either the first conversion candidate or the second conversion candidate in accordance with the determination result while outputting selection information indicative of which of the two candidates has been selected.

(3) The memory control apparatus as described in paragraph (2) above,
wherein the conversion determination section includes:
a detector configured to detect per bit a combination of transitions from the first value to the second value or from the second value to the first value with regard to the pre-read data, the first conversion candidate and the second conversion candidate;

a counter configured to count the number of bits detected for each of the combinations;

a selector configured to select the larger of two values of which one is the number of bits transitioning from the first value to the second value and of which the other is the number of bits transitioning from the second value to the first value with regard to each of the first conversion candidate and the second conversion candidate; and a comparator configured to compare the selected numbers of transitioning bits with regard to each of the first conversion candidate and the second conversion candidate to select as the determination result either the first conversion candidate or the second conversion candidate in such a manner that the number of transitioning bits is the smaller of the two numbers compared.

(4) The memory control apparatus as described in paragraph (2) or (3) above, further including a write buffer configured to hold the write data and the selection information, wherein the conversion control section causes the write data held in the write buffer to be converted to either the first conversion candidate or the second conversion candidate in accordance with the determination result while causing the write buffer to hold the selection information indicative of either of the two candidates to which the write data is converted.

(5) The memory control apparatus as described in any one of paragraphs (2) through (4) above, wherein the first conversion candidate is a value obtained by performing an exclusive-OR operation on the write buffer and on a predetermined value, and the second conversion candidate is a value obtained by performing an exclusive-OR operation on the write buffer and on the inverted value of the predetermined value.

(6) The memory control apparatus as described in any one of paragraphs (2) through (5) above, wherein the first conversion candidate is acquired by performing either a predetermined bit shift operation or a predetermined bit transposition operation or a combination of these operations on the value obtained by performing an exclusive-OR operation on the write buffer and on a predetermined value, and the second conversion candidate is acquired by performing either the predetermined bit shift operation or the predetermined bit transposition operation or a combination of these operations on the value obtained by performing an exclusive-OR operation on the write buffer and on the inverted value of the predetermined value.

(7) The memory control apparatus as described in any one of paragraphs (2) through (6) above, wherein the first conversion candidate is the same value as that held in the write buffer, and the second conversion candidate is the inverted value of the value held in the write buffer.

(8) The memory control apparatus as described in any one of paragraphs (2) through (7) above, wherein the first conversion candidate and the second conversion candidate are each determined in such a manner that either the larger of two values of which one is the number of bits transitioning from the first value to the second value and of which the other is the number of bits transitioning from the second value to the first value upon transition of the pre-read data to the first conversion candidate, or the larger of two values of which one is the number of bits transitioning from the first value to the second value and of which the other is the number of bits transitioning from the second value to the first value upon transition of the pre-read data to the second conversion candidate, becomes half or less of the total bit length of the write data.

(9) A memory control apparatus including:

a pre-read processing section configured to read pre-read data from a data area to be written to before a write process in a predetermined data area of a memory cell array holding either a first value or a second value per bit;

a conversion determination section configured such that upon selectively allowing the pre-read data to transition to either a first conversion candidate or a second conversion candidate of the write data to be written in the write process, the conversion determination section compares the larger of two values of which one is the number of bits transitioning from the first value to the second value and of which the other is the number of bits transitioning from the second value to the first value upon transition of the pre-read data to the first conversion candidate, with half the total bit length of the write data so as to generate a determination result for selecting the first conversion candidate if the larger number of transitioning bits of the two numbers compared is less than half the total bit length of the write data and for selecting the second conversion candidate if otherwise; and a conversion control section configured to select either the first conversion candidate or the second conversion candidate in accordance with the determination result while outputting selection information indicative of which of the two candidates has been selected.

(10) A memory apparatus including:

a memory cell array configured to hold either of a first value or a second value per bit;

a pre-read processing section configured to read pre-read data from a data area to be written to before a write process in a predetermined data area of the memory cell array;

a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and a conversion control section configured to select either the first conversion candidate or the second conversion candidate in accordance with the determination result while outputting selection information indicative of which of the two candidates has been selected.

(11) The memory apparatus as described in paragraph (10) above, wherein the memory cell array is composed of variable resistive elements.

(12) An information processing system including:

a memory cell array configured to hold either of a first value or a second value per bit;

a pre-read processing section configured to read pre-read data from a data area to be written to before a write process in a predetermined data area of the memory cell array;

a conversion determination section configured such that upon selectively allowing the pre-read data to transition to either a first conversion candidate or a second conversion candidate of the write data to be written in the write process, the conversion determination section generates a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate;

a conversion control section configured to select either the first conversion candidate or the second conversion candidate in accordance with the determination result while outputting selection information indicative of which of the two candidates has been selected; and a host computer configured to issue a read command or a write command to the memory cell array.

(13) A memory control method including:

reading pre-read data from a data area to be written to before a write process in a predetermined data area of a memory cell array holding either a first value or a second value per bit;

upon selectively allowing the pre-read data to transition to either a first conversion candidate or a second conversion candidate of the write data to be written in the write process, generating a determination result for selecting either the first conversion candidate or the second conversion candidate based on the larger of two values of which one is the number of bits transitioning from the first value to the second value upon transition of the pre-read data to the first conversion candidate and of which the other is the number of bits transitioning from the second value to the first value upon transition of the pre-read data to the first conversion candidate; and selecting either the first conversion candidate or the second conversion candidate in accordance with the determination result while outputting selection information indicative of which of the two candidates has been selected.

The present disclosure contains subject matter related to that disclosed in Japanese Priority Patent Application JP 2013-048776 filed in the Japan Patent Office on Mar. 12, 2013, the entire content of which is hereby incorporated by reference.

What is claimed is:

1. A memory control apparatus comprising:
a pre-read processing section configured to read pre-read data from a data area to be written to before a write process in a predetermined data area of a memory cell array holding either a first value or a second value per bit;
a conversion determination section configured such that upon selectively allowing said pre-read data to transition to either a first conversion candidate or a second conversion candidate of the write data to be written in said write process, said conversion determination section generates a determination result for selecting either said first conversion candidate or said second conversion candidate based on the larger of two values of which one is the number of bits transitioning from said first value to said second value upon transition of said pre-read data to said first conversion candidate and of which the other is the number of bits transitioning from said second value to said first value upon transition of said pre-read data to said first conversion candidate; and
a conversion control section configured to select either said first conversion candidate or said second conversion candidate in accordance with said determination result while outputting selection information indicative of which of the two candidates has been selected.

2. A memory control apparatus comprising:
a pre-read processing section configured to read pre-read data from a data area to be written to before a write process in a predetermined data area of a memory cell array holding either a first value or a second value per bit;
a conversion determination section configured to generate a determination result for selectively allowing said pre-read data to transition to either a first conversion candidate or a second conversion candidate of the write data to be written in said write process through comparison of two values, one of the two values compared being the larger of two values of which one is the number of bits transitioning from said first value to said second value and of which the other is the number of bits transitioning from said second value to said first value upon transition of said pre-read data to said first conversion candidate, the other of the two values compared being the larger of two values of which one is the number of bits transitioning from said first value to said second value and of which the other is the number of bits transitioning from said second value to said first value upon transition of said pre-read data to said second conversion candidate, the selection of either said first conversion candidate or said second conversion candidate being made in such a manner that the number of transitioning bits is the smaller of the two numbers compared; and
a conversion control section configured to select either said first conversion candidate or said second conversion candidate in accordance with said determination result while outputting selection information indicative of which of the two candidates has been selected.

3. The memory control apparatus according to claim 2, wherein said conversion determination section includes:
a detector configured to detect per bit a combination of transitions from said first value to said second value or from said second value to said first value with regard to said pre-read data, said first conversion candidate and said second conversion candidate;
a counter configured to count the number of bits detected for each of the combinations;
a selector configured to select the larger of two values of which one is the number of bits transitioning from said first value to said second value and of which the other is the number of bits transitioning from said second value to said first value with regard to each of said first conversion candidate and said second conversion candidate; and
a comparator configured to compare the selected numbers of transitioning bits with regard to each of said first conversion candidate and said second conversion candidate to select as said determination result either said first conversion candidate or said second conversion candidate in such a manner that the number of transitioning bits is the smaller of the two numbers compared.

4. The memory control apparatus according to claim 2, further comprising
a write buffer configured to hold said write data and said selection information,
wherein said conversion control section causes the write data held in said write buffer to be converted to either said first conversion candidate or said second conversion candidate in accordance with said determination result while causing said write buffer to hold said selection information indicative of either of the two candidates to which said write data is converted.

5. The memory control apparatus according to claim 4, wherein said first conversion candidate is a value obtained by performing an exclusive-OR operation on said write buffer and on a predetermined value, and said second conversion candidate is a value obtained by performing an exclusive-OR operation on said write buffer and on the inverted value of said predetermined value.

6. The memory control apparatus according to claim 4, wherein said first conversion candidate is acquired by performing either a predetermined bit shift operation or a predetermined bit transposition operation or a combination of these operations on the value obtained by performing an exclusive-OR operation on said write buffer and on a predetermined value, and said second conversion candidate is acquired by performing either said predetermined bit shift operation or said predetermined bit transposition operation or a combination of these operations on the value obtained by performing an exclusive-OR operation on said write buffer and on the inverted value of said predetermined value.

7. The memory control apparatus according to claim 4, wherein said first conversion candidate is the same value as that held in said write buffer, and said second conversion candidate is the inverted value of the value held in said write buffer.

8. The memory control apparatus according to claim 2, wherein said first conversion candidate and said second conversion candidate are each determined in such a manner that either the larger of two values of which one is the number of bits transitioning from said first value to said second value and of which the other is the number of bits transitioning from said second value to said first value upon transition of said pre-read data to said first conversion candidate, or the larger of two values of which one is the number of bits transitioning from said first value to said second value and of which the other is the number of bits transitioning from said second value to said first value upon transition of said pre-read data to said second conversion candidate, becomes half or less of the total bit length of said write data.

9. A memory control apparatus comprising:
a pre-read processing section configured to read pre-read data from a data area to be written to before a write process in a predetermined data area of a memory cell array holding either a first value or a second value per bit;
a conversion determination section configured such that upon selectively allowing said pre-read data to transition to either a first conversion candidate or a second conversion candidate of the write data to be written in said write process, said conversion determination section compares the larger of two values of which one is the number of bits transitioning from said first value to said second value and of which the other is the number of bits transitioning from said second value to said first value upon transition of said pre-read data to said first conversion candidate, with half the total bit length of said write data so as to generate a determination result for selecting said first conversion candidate if the larger number of transitioning bits of the two numbers compared is less than half said total bit length of said write data and for selecting said second conversion candidate if otherwise; and
a conversion control section configured to select either said first conversion candidate or said second conversion candidate in accordance with said determination result while outputting selection information indicative of which of the two candidates has been selected.

10. A memory apparatus comprising:
a memory cell array configured to hold either of a first value or a second value per bit;
a pre-read processing section configured to read pre-read data from a data area to be written to before a write process in a predetermined data area of said memory cell array;
a conversion determination section configured such that upon selectively allowing said pre-read data to transition to either a first conversion candidate or a second conversion candidate of the write data to be written in said write process, said conversion determination section generates a determination result for selecting either said first conversion candidate or said second conversion candidate based on the larger of two values of which one is the number of bits transitioning from said first value to said second value upon transition of said pre-read data to said first conversion candidate and of which the other is the number of bits transitioning from said second value to said first value upon transition of said pre-read data to said first conversion candidate; and
a conversion control section configured to select either said first conversion candidate or said second conversion candidate in accordance with said determination result while outputting selection information indicative of which of the two candidates has been selected.

11. The memory apparatus according to claim 10, wherein said memory cell array is composed of variable resistive elements.

12. An information processing system comprising:
a memory cell array configured to hold either of a first value or a second value per bit;
a pre-read processing section configured to read pre-read data from a data area to be written to before a write process in a predetermined data area of said memory cell array;
a conversion determination section configured such that upon selectively allowing said pre-read data to transition to either a first conversion candidate or a second conversion candidate of the write data to be written in said write process, said conversion determination section generates a determination result for selecting either said first conversion candidate or said second conversion candidate based on the larger of two values of which one is the number of bits transitioning from said first value to said second value upon transition of said pre-read data to said first conversion candidate and of which the other is the number of bits transitioning from said second value to said first value upon transition of said pre-read data to said first conversion candidate;
a conversion control section configured to select either said first conversion candidate or said second conversion candidate in accordance with said determination result while outputting selection information indicative of which of the two candidates has been selected; and
a host computer configured to issue a read command or a write command to said memory cell array.

13. A memory control method comprising:
reading pre-read data from a data area to be written to before a write process in a predetermined data area of a memory cell array holding either a first value or a second value per bit;
upon selectively allowing said pre-read data to transition to either a first conversion candidate or a second conversion candidate of the write data to be written in said write process, generating a determination result for selecting either said first conversion candidate or said second conversion candidate based on the larger of two values of which one is the number of bits transitioning from said first value to said second value upon transition of said pre-read data to said first conversion candidate and of which the other is the number of bits transitioning from said second value to said first value upon transition of said pre-read data to said first conversion candidate; and selecting either said first conversion candidate or said second conversion candidate in accordance with said determination result while outputting selection information indicative of which of the two candidates has been selected.

* * * * *